(12) United States Patent
Mannou et al.

(10) Patent No.: US 6,590,918 B1
(45) Date of Patent: Jul. 8, 2003

(54) SEMICONDUCTOR LASER DEVICE AND METHOD FOR PRODUCING THE SAME

(75) Inventors: Masaya Mannou, Nara (JP); Toshiya Fukuhisa, Osaka (JP)

(73) Assignee: Matsushita Electronics Corporation, Osaka (JP)

( * ) Notice: Subject to any disclaimer, the term of this patent is extended or adjusted under 35 U.S.C. 154(b) by 198 days.

(21) Appl. No.: 09/713,175

(22) Filed: Nov. 15, 2000

(30) Foreign Application Priority Data

Nov. 17, 1999 (JP) .......................................... 11-327558

(51) Int. Cl.[7] .............................................. H01S 3/19
(52) U.S. Cl. .............................. 372/45; 372/44; 257/79
(58) Field of Search ................... 372/45, 44; 257/607, 257/79, 97; 438/45, 46

(56) References Cited

U.S. PATENT DOCUMENTS

| | | |
|---|---|---|
| 4,639,275 A | 1/1987 | Holonyak, Jr. |
| 4,792,958 A * | 12/1988 | Ohba et al. .................... 372/45 |
| 4,799,228 A * | 1/1989 | Nagasaka et al. ............. 372/45 |
| 4,907,239 A * | 3/1990 | Hayakawa et al. ........... 375/45 |
| 4,961,196 A * | 10/1990 | Endo ............................ 372/45 |
| 5,745,517 A * | 4/1998 | Bour et al. .................... 372/45 |

FOREIGN PATENT DOCUMENTS

| | | |
|---|---|---|
| JP | 63-51557 | 10/1988 |
| WO | WO 82/03946 | 11/1982 |

\* cited by examiner

Primary Examiner—Albert W. Paladini
(74) Attorney, Agent, or Firm—RatnerPrestia

(57) ABSTRACT

A method for producing a semiconductor laser element includes steps of: forming a semiconductor layered structure on a first conductivity type semiconductor substrate, the semiconductor layered structure including a first conductivity type cladding layer, a quantum well active layer, and a first cladding layer of a second conductivity type; forming a diffusion control layer in a predetermined region on the semiconductor layered structure; forming a material layer which acts as an impurity source on the diffusion control layer; and diffusing impurities by a first thermal treatment from the material layer through the diffusion control layer into at least a part of the semiconductor layered structure including at least a part of the quantum well active layer, thereby forming an impurity diffusion region, wherein a part of the quantum well active layer in at least one cavity end face is disordered by diffusion of the impurities.

53 Claims, 33 Drawing Sheets

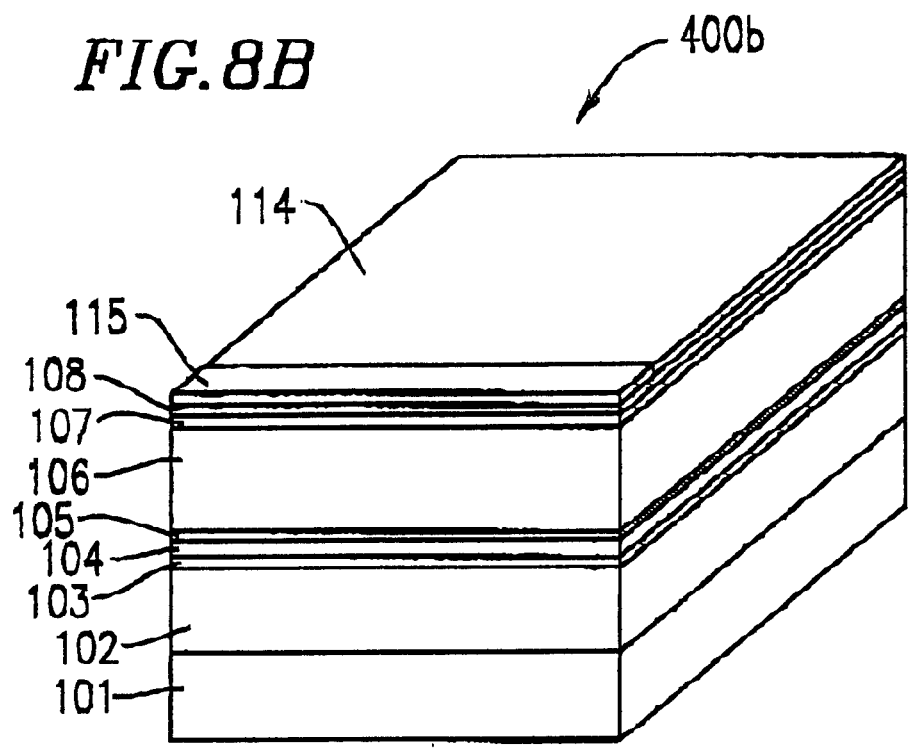

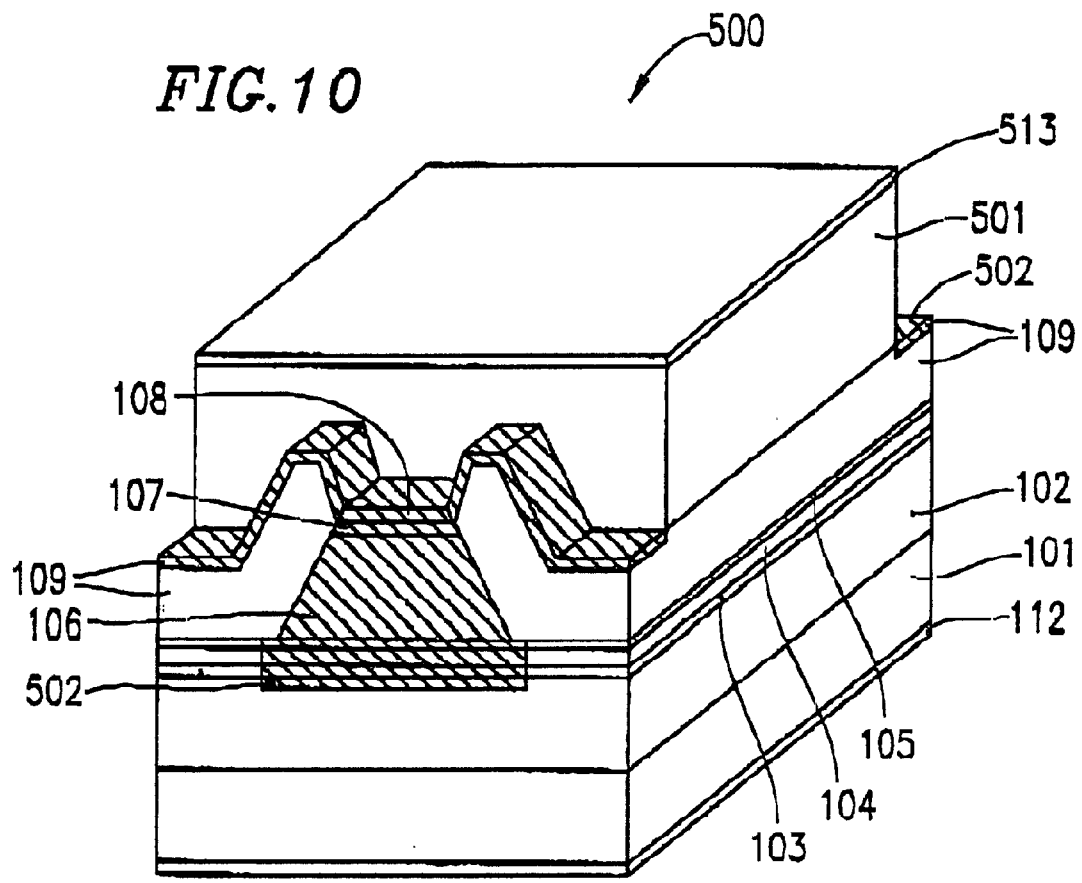

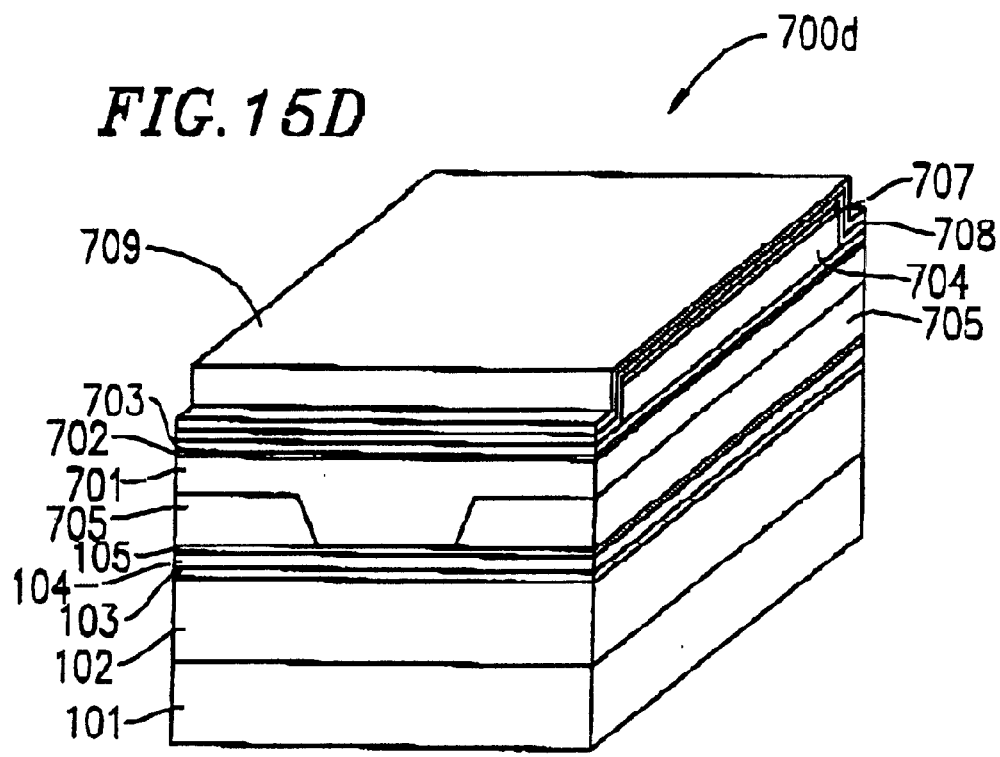
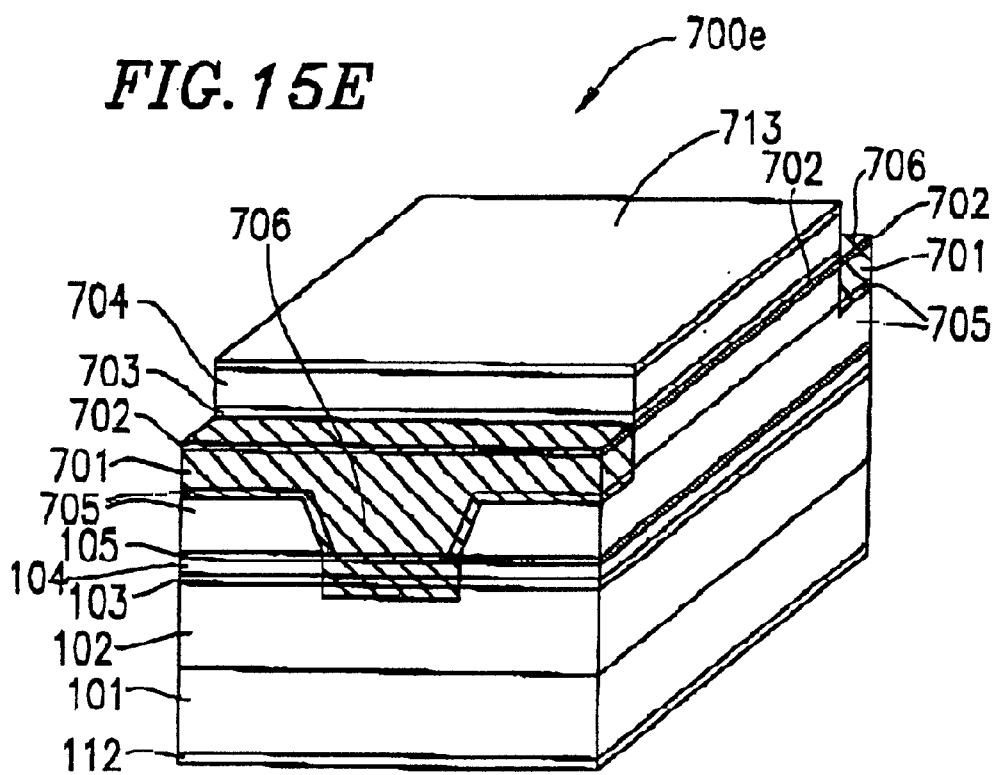

SEMICONDUCTOR LASER DEVICE AND METHOD FOR PRODUCING THE SAME

BACKGROUND OF THE INVENTION

1. Field of the Invention

The present invention relates to a method for producing a semiconductor laser element, and specifically to a method for producing, with improved production yield, a high-output semiconductor laser element having an end face window structure. The present invention also relates to a semiconductor laser element which is produced by such a production method.

2. Description of the Related Art

In recent years, as a light source for an information processing apparatus which is used with an optical disk, such as a DVD (digital versatile disk), etc, a semiconductor laser element which is made by using AlGaInP mixed crystal and which emits light with a wavelength in the vicinity of 600 nm has been practically used. A rewritable optical disk such as a DVD requires an optical output of 30 mW or more. Moreover, in order to realize a smaller, faster information processing apparatus, an optical output of about 50 mW to 100 mW is required.

In general, deterioration in emission characteristics due to crystal breakage in a laser end face restricts the increase in output power of a semiconductor laser element. This is an important problem in a semiconductor laser element made using AlGaInP mixed crystal. In order to effectively increase the output power of a semiconductor laser element, the semiconductor laser element is provided with an end face window structure in which an end face of a laser cavity is made of a material transparent to laser light. An example of such an arrangement is disclosed in Suzuki, et al., "Electronics letters", Vol. 20, p. 363, 1984. This document describes an end face window structure formed by utilizing a disorder phenomenon caused in a quantum well structure. Specifically, in a double hetero structure including a quantum well structure used as an active layer, impurities (atoms) are diffused in the quantum well structure, whereby a disorder phenomenon is caused in the quantum well structure.

FIG. 16 is a perspective view showing a conventional semiconductor laser element 900. The semiconductor laser element 900 is a lateral mode controlled AlGaInP red semiconductor laser element which has an end face window structure produced by utilizing the disorder phenomenon as described above.

The semiconductor laser element 900 includes an n-type GaAs substrate 901, an n-type AlGaInP cladding layer 902, an active layer 903 which has a quantum well structure including a GaInP well layer (not shown) and an AlGaInP barrier layer (not shown), a p-type AlGaInP first cladding layer 904, a p-type GaInP etching stop layer 905, a p-type AlGaInP second cladding layer 906, a p-type GaInP band discontinuity relaxation layer 907, an n-type GaAs current confinement layer 908, a p-type GaAs contact layer 909, an n-electrode 911, and a p-electrode 912.

In the semiconductor laser element 900 having such a structure, the p-type AlGaInP second cladding layer 906 is formed so as to have a ridge shape, whereby lateral mode control of laser light is achieved. Furthermore, an impurity diffusion region 910 containing Zn atoms diffused therethrough is provided as an end face window structure of the laser element 900.

Next, a method for producing the conventional semiconductor laser element 900 is described. FIGS. 17A through 17F show steps of producing the semiconductor laser element 900. In FIG. 16 and FIGS. 17A through 17F, like reference numerals denote like parts. For the purpose of simplification, the production method is herein described for one semiconductor laser element 900, although a plurality of semiconductor laser elements 900 are produced simultaneously in an actual production process.

In the first step, by an MOVPE (Metal Organic Vapor Phase Epitaxy) method, an n-type AlGaInP cladding layer 902, an active layer 903 which has a quantum well structure including a GaInP well layer (not shown) and an AlGaInP barrier layer (not shown), a p-type AlGaInP first cladding layer 904, a p-type GaInP etching stop layer 905, a p-type AlGaInP second cladding layer 906, and a p-type GaInP band discontinuity relaxation layer 907 are sequentially formed on an n-type GaAs substrate 901, thereby obtaining a layered structure 900a having a double hetero structure as shown in FIG. 17A.

Next, an $SiO_2$ film 913 is formed on the layered structure 900a, and the $SiO_2$ film 913 is patterned by wet etching so as to form stripe opening portions each having a width of several tens of micrometers at the interval of several hundreds of micrometers in a direction perpendicular to a cavity direction of a resulting laser element. Then, a ZnO film 914 is formed by sputtering entirely over the $SiO_2$ film 913 and in the stripe opening portions, and the ZnO film 914 is removed by wet-etching except for part of the ZnO film 914 which has been formed in the stripe opening portions, thereby obtaining a layered structure 900b as shown in FIG. 17B.

Then, an $SiO_2$ film 915 is formed entirely over the upper surfaces of the $SiO_2$ film 913 and the ZnO film 914. Thereafter, the resultant structure is annealed in a nitrogen atmosphere. In this annealing process, the ZnO film 914 formed in the stripe opening portions is used as a Zn provision layer to diffuse Zn atoms throughout the layers from the upper surface of the p-type GaInP band discontinuity relaxation layer 907 down to the n-type AlGaInP cladding layer 902. As a result, the impurity diffusion region 910 is formed, whereby a layered structure 900c is obtained as shown in FIG. 17C.

In the impurity diffusion region 910, the active layer 903 having a quantum well structure which includes the GaInP well layer (not shown) and the AlGaInP barrier layer (not shown) is disordered. In the impurity diffusion region 910, the band gap in a disordered portion of a quantum well is larger than that in a non-disordered portion, and thus, the disordered portion of the quantum well acts as an end face window structure.

Next, the $SiO_2$ film 913, the ZnO film 914, and the $SiO_2$ film 915 are removed by wet-etching, and an $SiO_2$ film 916 is formed over the upper surface of the resultant structure. The $SiO_2$ film 916 is patterned by wet-etching into a stripe shape so as to have a width of several micrometers. (As described above, in an actual production process, a plurality of semiconductor laser elements 900 are produced simultaneously, and a plurality of $SiO_2$ films 916 are formed into a stripe pattern so that the longitudinal direction of each stripe is equal to a laser cavity direction.) The $SiO_2$ films 916 are used as a mask to partially remove the p-type GaInP band discontinuity relaxation layer 907 by wet-etching so as to provide a ridge structure to the p-type GaInP band discontinuity relaxation layer 907. Then, the p-type AlGaInP second cladding layer 906 is etched with a wet-etching solution which can selectively etch the p-type AlGaInP second cladding layer 906, so that a ridge-shaped p-type AlGaInP second cladding layer 906 is formed. As a result, a layered structure 900d is obtained as shown in FIG. 17D. (For example, sulfuric acid may be used as the wet-etching solution for the selective etching because the etching rate thereof is different for AlGaInP and for GaInP.) In the layered structure 900d, the p-type GaInP etching stop layer 905 is exposed in the region(s) from which the p-type AlGaInP second cladding layer 906 has been completely removed.

Then, the $SiO_2$ film 916 is also used as a mask for selective growth to grow, by an MOVPE method, an n-type GaAs current confinement layer 908 on the p-type GaInP etching stop layer 905 so as to cover side surfaces of the p-type AlGaInP second cladding layer 906 and the p-type GaInP band discontinuity relaxation layer 907 thereby obtaining a layered structure 900e as shown in FIG. 17E.

Then, the $SiO_2$ film 916 is removed by wet-etching, and a p-type GaAs contact layer 909 is formed by an MOVPE method over the entire upper surface of the layered structure 900e from which the $SiO_2$ film 916 has been removed. In the final step, an n-electrode 911 and a p-electrode 912 are formed, thereby obtaining a layered structure 900f as shown in FIG. 17F. In the actual production process, the resultant layered structure is cleaved along a plane in the impurity diffusion region 910 which is perpendicular to the longitudinal direction of the ridge stripes so as to obtain lager cavities each having a pair of cavity end faces. As a result, a single semiconductor laser element 900 is obtained.

Now, an operation of the above-structured conventional semiconduotor laser element 900 is described.

Referring again to FIG. 16, when the p-electrode 912 is positively biased with respect to the n-electrode 911, holes and electrons are injected from the both of the electrodes 911 and 912 toward the active layer 903. At that time, an electrical current is confined inside the ridge by the n-type GaAs current confinement layer 908 formed so as to cover the side faces of the ridge, and laser gain is obtained only inside the ridge, whereby laser oscillation is caused.

Herein, light generated in the active layer 903 is absorbed in the n-type GaAs current confinement layer 908 on the side faces of the ridge. This means that the effective refractive index of light in the active layer 903 has an imaginary part resulting from the light absorption, and the imaginary part mainly denotes a lateral distribution of light with respect to the ridge. This distribution confines laser light in a lateral direction, whereby satisfactory light beam characteristics are obtained.

Furthermore, since laser light is laterally wider in a higher mode than in a fundamental mode, in a higher mode, more leaked light is absorbed in the ridge portion, and thus, the laser oscillation in a higher mode is strongly suppressed. In such a structure, the light absorption effect is not negligible even in a fundamental mode. Therefore, a stronger suppression of light confinement and a suppression of a higher mode necessarily result in an increase of optical loss as compared with a fundamental mode. As a result, it becomes difficult to avoid an increase of a threshold current and a decrease of differential quantum efficiency.

In the above-described process for producing the conventional semiconductor laser element 900 having an end face window structure, a problem occurs in the step of selectively removing the p-type AlGaInP second cladding layer 906. As described above, etching is stopped at the p-type GaInP etching stop layer 905 except in the impurity diffusion region 910. However, in the impurity diffusion region 910, the p-type GaInP etching stop layer 905 is disordered so that mixed crystals are formed therein, and therefore, the etching rate becomes higher, whereby the etching selectivity (e.g., controllability of, etching) between AlGaInP and GaInP accordingly decreases. As a result, etching is not stopped at the p-type GaInP etching stop layer 905 but continues to the active layer 903 having the quantum well structure and the p-type AlGaInP first cladding layer 904. In the case where etching is not stopped at the p-type GaInP etching stop layer 905 in the impurity diffusion region 910, the width of the ridge differs in the impurity diffusion region 910 and in a region through which impurities are not diffused. This increases optical loss in the waveguide formed by the ridge structure, and thus increases the threshold current and the operation current. As a result, reliability of the laser element 900 significantly deteriorates.

SUMMARY OF THE INVENTION

According to one aspect of the present invention, A method for producing a semiconductor laser element includes steps of: forming a semiconductor layered structure on a first conductivity type semiconductor substrate, the semiconductor layered structure including a first conductivity type cladding layer, a quantum well active layer, and a first cladding layer of a second conductivity type; forming a diffusion control layer in a predetermined region on the semiconductor layered structure; forming a material layer which acts do an impurity source on the diffusion control layer; and diffusing impurities by a first thermal treatment from the material layer through the diffusion control layer into at least a part of the semiconductor layered structure including at least a part of the quantum well active layer, thereby forming an impurity diffusion region, wherein a part of the quantum well active layer in at least one cavity end face is disordered by diffusion of the impurities.

In one embodiment of the present invention, the semiconductor layered structure includes a double hetero structure.

In another embodiment of the present invention, the semiconductor layered structure is epitaxially grown on the first conductivity type semiconductor substrate.

In still another embodiment of the present invention, the quantum well active layer is formed between the first conductivity type cladding layer and the first cladding layer of the second conductivity type.

In still another embodiment of the present invention, the quantum well active layer has a quantum well structure including at least one well layer and a plurality of barrier layers.

In still another embodiment of the present invention, the thickness of the quantum well active layer is equal to or less than about 20 nm.

In still another embodiment of the present invention, the diffusion control layer is formed on an upper surface of the semiconductor layered structure.

In still another embodiment of the present invention, the diffusion control layer is epitaxially grown on the upper surface of the semiconductor layered structure.

In still another embodiment of the present invention, the diffusion control layer includes AlGaAs mixed crystals.

In still another embodiment of the present invention, the method for producing a semiconductor laser element further includes a step of forming a dielectric film on the material layer.

In still another embodiment of the present invention, the diffusion control layer includes a material in which a diffusion rate of the impurities are lower than in the quantum well active layer.

In still another embodiment of the present invention, the semiconductor layered structure includes AlGaInP mixed crystals.

In still another embodiment of the present invention, an amount of the impurities diffused into the semiconductor layered structure is controlled by controlling at least one of a conductivity type, a composition, and a thickness of the diffusion control layer.

In still another embodiment of the present invention, an amount of the impurities diffused into the semiconductor layered structure is controlled by controlling at least one of a temperature and a time length of the first thermal treatment.

In still another embodiment of the present invention, the diffusion control layer is of a first conductivity type.

In still another embodiment of the present invention, the diffusion control layer is of a second conductivity type.

Instill another embodiment of the present invention, the diffusion control layer is non-conductive.

In still another embodiment of the present invention, the diffusion control layer includes GaAs.

In still another embodiment of the present invention, a thickness of the diffusion control layer is from about 50 nm to about 300 nm. Preferably, the thickness of the diffusion control layer may be from about 50 nm to about 200 nm.

In still another embodiment of the present invention, a temperature of the first thermal treatment is equal to or less than about 650° C. Preferably, the temperature of the first thermal treatment may be from about 500° C. to about 650° C.

In still another embodiment of the present invention, the material layer includes at least one of Zn and Mg.

In still another embodiment of the present invention, the material layer includes ZnO.

In still another embodiment of the present invention, a thickness of the material layer is equal to or less than about 50 nm. Preferably, the thickness of the material layer may be from about 10 nm to about 50 nm.

In still another embodiment of the present invention, the dielectric film includes at least one of $SiO_2$, $Al_2O_3$, $TiO_2$, and SiN.

In still another embodiment of the present invention, the diffusion control layer includes AlGaAs in which an AlAs composition is about 20% or more.

In still another embodiment of the present invention, the semiconductor layered structure further includes a second conductivity type contact layer.

In still another embodiment of the present invention, the second conductivity type contact layer includes AlGaAs in which an AlAs composition is about 20% or less.

In still another embodiment of the present invention, an undoped semiconductor layer is formed between the first conductivity type cladding layer and the quantum well active layer.

In still another embodiment of the present invention, a thickness of the undoped semiconductor layer is equal to or greater than about 40 nm.

In still another embodiment of the present invention, the method for producing a semiconductor laser element further includes a step of forming a low reflective coating film on the at least one cavity end face.

In still another embodiment of the present invention, the semiconductor layered structure includes: a second conductivity type etching stop layer formed on the first cladding layer of the second conductivity type; and a second cladding layer of a second conductivity type formed on the second conductivity type etching stop layer.

In still another embodiment of the present invention, the method for producing a semiconductor laser element further includes steps of: etching the second cladding layer of the second conductivity type into a ridge shape; and forming a first conductivity type current confinement layer on a side face of the second cladding layer of the second conductivity type.

In still another embodiment of the present invention, the method for producing a semiconductor laser element further includes a stop of removing the diffusion control layer, wherein after the step of removing the diffusion control layer, the second cladding layer of the second conductivity type is etched into a ridge shape.

In still another embodiment of the present invention, the conductivity type of the diffusion control layer is the first conductivity type.

In still another embodiment of the present invention, the method for producing a semiconductor laser element further includes a step of performing a second thermal treatment after the step of forming the first conductivity type current confinement layer.

In still another embodiment of the present invention, wherein: the quantum well active layer has a quantum well structure including at least one well layer and a plurality of barrier layers; and a thickness of the quantum well structure is equal to or less than about 7 nm. Preferably, the thickness of the quantum well structure may be from about 3 nm to about 7 nm.

Instill another embodiment of the present invention, a thickness of the second conductivity type etching stop layer is equal to or less than about 15 nm. Preferably, the thickness of the second conductivity type etching stop layer may be from about 3 nm to about 15 nm.

In still another embodiment of the present invention, the step of forming the material layer is performed after the step of forming the first conductivity type current confinement layer.

In still another embodiment of the present invention, in the step of diffusing impurities into at least a part of the semiconductor layered structure, impurities diffused into a part of the second cladding layer of the second conductivity type, and a concentration of the impurities diffused in a part of the second cladding layer of the second conductivity type within the impurity diffusion region is equal to or less than about $1 \times 10^{18}$ $cm^3$.

In still another embodiment of the present invention, the semiconductor layered structure further includes a second conductivity type etching stop layer formed on the first cladding layer of the second conductivity type, the method further comprising steps of: forming a first conductivity type current confinement layer on the semiconductor layered structure: forming an opening portion in the first conductivity type current confinement layer; and forming a second cladding layer of a second conductivity type on the first conductivity type current confinement layer and the opening portion, wherein the step of forming the diffusion control layer is performed after the step of forming the second cladding layer of the second conductivity type.

According to another aspect of the present invention, a semiconductor laser element includes: a first conductivity type semiconductor substrate; and a semiconductor layered structure, wherein the semiconductor layered structure includes: a first conductivity type cladding layer; a quantum well active layer; a first cladding layer of a second conductivity type; a second conductivity type etching stop layer: a second cladding layer of a second conductivity type having a ridge shape; and a first conductivity type current confinement layer formed on a side face of the second cladding layer of the second conductivity type, wherein a part of the quantum well active layer which is positioned under the second cladding layer of the second conductivity type and on at least one cavity end face is disordered by impurities.

In one embodiment of the present invention, the semiconductor layered structure includes a double hetero structure.

In another embodiment of the present invention, the quantum well active layer is formed between the first conductivity type cladding layer and the first cladding layer of the second conductivity type.

In still another embodiment of the present invention, the quantum well active layer has a quantum well structure including at least one well layer and a plurality of barrier layers.

In still another embodiment of the present invention, the semiconductor layered structure includes AlGaInP mixed crystals.

In still another embodiment of the present invention, the semiconductor layered structure further includes a second conductivity type contact layer.

In still another embodiment of the present invention, the semiconductor laser element further includes a low reflective coating film on the at least one cavity end face.

According to still another aspect of the present invention, a semiconductor laser element includes: a first conductivity type semiconductor substrate; and a semiconductor layered structure, wherein the semiconductor layered structure includes: a first conductivity type cladding layer; a quantum well active layer; a first cladding layer of a second conductivity type; a second conductivity type etching stop layer: a first conductivity type current confinement layer having an opening portion; and a second cladding layer of a second conductivity type provided at least in the opening portion, wherein a part of the quantum well active layer which is positioned under the opening portion and on at least one cavity end face is disordered by impurities.

In one embodiment of the present invention, the semiconductor layered structure includes a double hetero structure.

In another embodiment of the present invention, the quantum well active layer is formed between the first conductivity type cladding layer and the first cladding layer of the second conductivity type.

In still another embodiment of the present invention, the quantum well active layer has a quantum well structure including at least one well layer and a plurality of barrier layers.

In still another embodiment of the present invention, the semiconductor layered structure includes AlGaInP mixed crystals.

In still another embodiment of the present invention, the semiconductor layered structure further includes a second conductivity type contact layer.

Thus, the invention described herein makes possible the advantages of (1) providing a method for diffusing impurities in which a stable etching can be performed with high repeatability, (2) suppressing optical lose in the waveguide, and (3) improving the production yield and reliability of a semiconductor laser element.

These and other advantages of the present invention will become apparent to those skilled in the art upon reading and understanding the following detailed description with reference to the accompanying figures.

BRIEF DESCRIPTION OF THE DRAWINGS

FIGS. 8B through 8F show steps of a method for producing the semiconductor laser element having an end face window structure according to embodiment 6.

FIG. 10 shows a semiconductor laser element having an end face window structure according to embodiment 8 of the present invention.

FIGS. 11A through 119E show steps of a method for producing the semiconductor laser element having an end face window structure according to embodiment 8.

FIGS. 15A through 15E show steps of a method for producing the semiconductor laser element having an end face window structure according to embodiment 10.

DESCRIPTION OF THE PREFERRED EMBODIMENTS

Figure 1A:
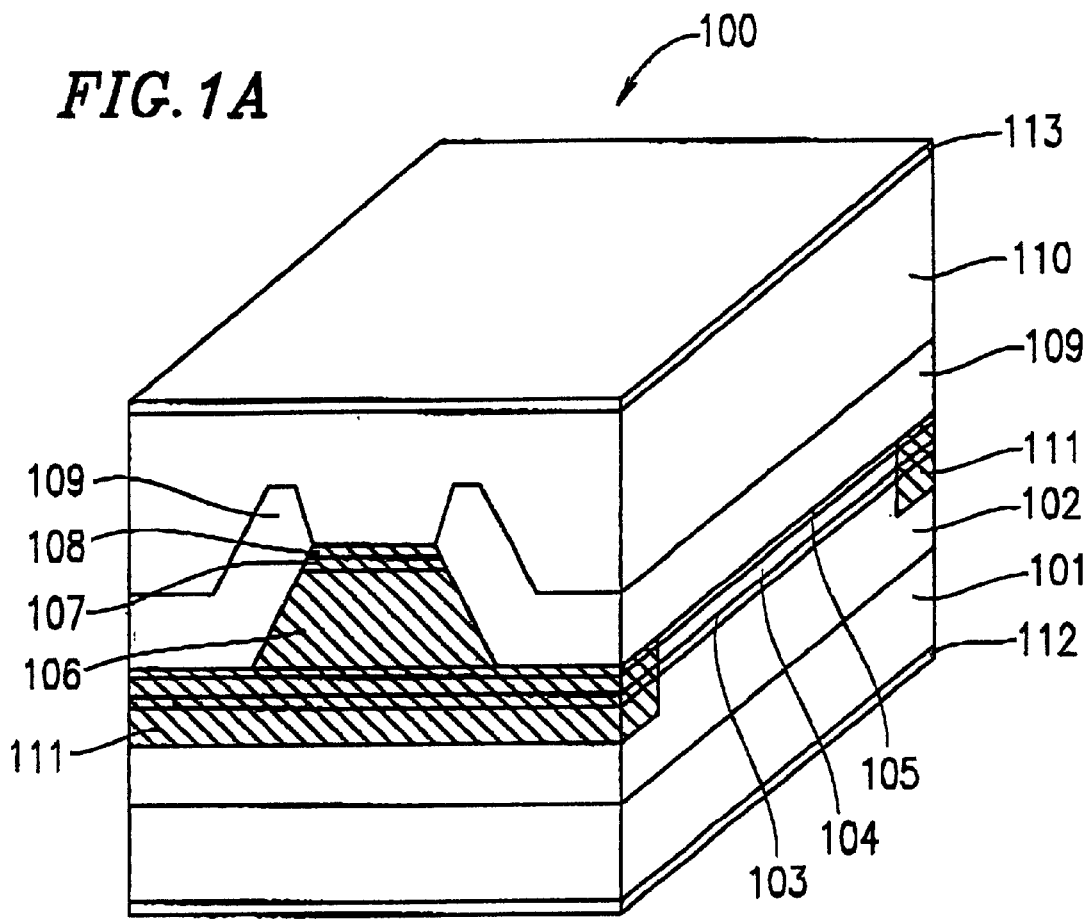
FIG. 1A shows a semiconductor laser element having an end face window structure according to embodiment 1 of the present invention.

Hereinafter, embodiments of the present invention will be described with reference to the drawings. In the drawings, portions shadowed by slanted lines denote "disordered" portions, which will be described later in the following descriptions.

Embodiment 1

A semiconductor laser element 100 according to embodiment 1 of the present invention and a production method thereof is described. FIG. 1A is a perspective view showing the semiconductor laser element 100. The semiconductor laser element 100 is a high-power AlGaInP red semiconductor laser element of a lateral mode control type, which has an end face window structure. A red semiconductor laser element such as the semiconductor laser element 100 can emit red, near-infrared, or infrared laser light.

The semiconductor laser element 100 includes an n-type GaAs substrate 101, an n-type AlGaInP cladding layer 102, an active layer 103 which has a quantum well structure, a p-type AlGaInP first cladding layer 104, a p-type GaInP etching stop layer 105, a p-type AlGaInP second cladding layer 106, a p-type GaInP band discontinuity relaxation layer 107, a p-type GaAs cap layer 108, an n-type GaAs current confinement layer 109, a p-type GaAs contact layer 110, an n-electrode 112, and a p-electrode 113.

Figure 1B:
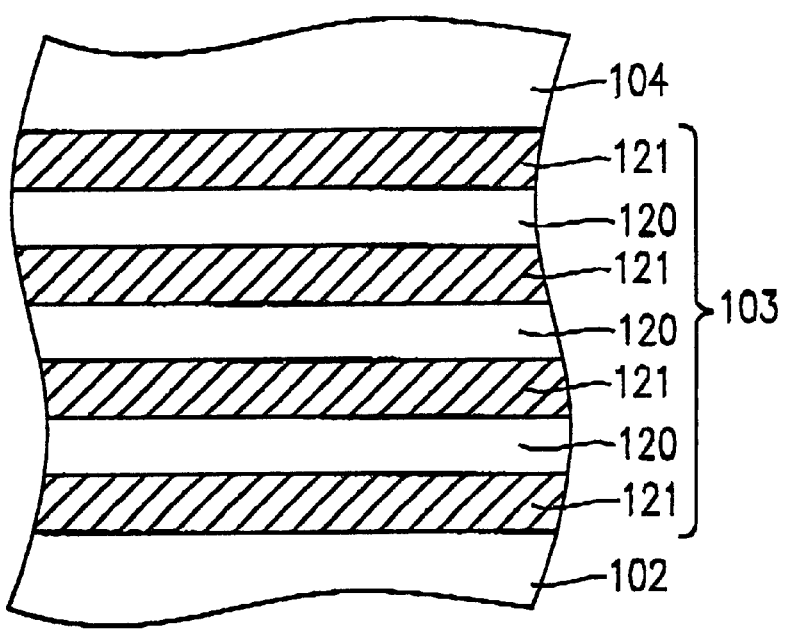
FIG. 1B shows a quantum well structure of a semiconductor laser element having an end face window structure according to the present invention.

FIG. 1B shows a structure of the active layer 103 in detail. FIG. 1B is an enlarged cross-sectional view showing the n-type AlGaInP cladding layer 102, the active layer 103, and the p-type AlGaInP first cladding layer 104. As shown in FIG. 1B, the active layer 103 includes a plurality of GaInP well layers 120 and a plurality of AlGaInP barrier layers 121.

Referring again to FIG. 1A, the p-type AlGaInP second cladding layer 106 is formed in a ridge shape, whereby lateral mode control of laser light is achieved. Moreover, an impurity diffusion region 111,which is an end face window structure of an end face of the laser element 100, is formed by a solid phase diffusion of Zn atoms.

Specifically, in end faces of the cavity of the semiconductor laser element 100, impurity diffusion regions 111 (regions shadowed with slant lines) are formed, in which Zn atoms are diffused In a downward direction perpendicular to the ridge direction (i.e., longitudinal direction) of the p-type AlGaInP second cladding layer 106. In the active layer 103 within the impurity diffusion regions 111, the quantum well structure 8 disordered. The phrase "quantum well structure is disordered" means that a uniform composition is obtained in the GaInP well layers 120 and the AlGaInP barrier layers 121.

Figure 1C:
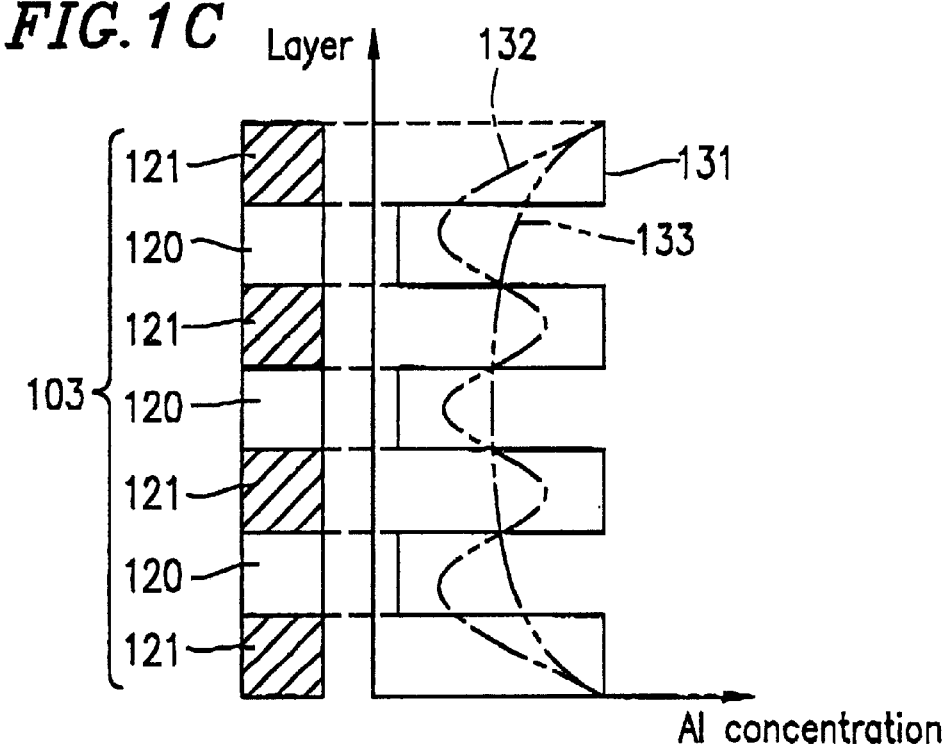
FIG. 1C shows a disordered state of a quantum well structure of a semiconductor laser element having an end face window structure according to the present invention.

FIG. 1C shows a disordered quantum well structure. FIG. 1C shows an Al concentration distribution in the GaInP well layers 120 and the AlGaInP barrier layers 121 which form the active layer 103. In FIG. 1C, a solid line 131 corresponds to a state in which the quantum well structure is not disordered: a dashed line 132 corresponds to a state in which the quantum well structure is disordered to some extent; and a two-dot chain line 133 corresponds to a state in which the quantum well structure is sufficiently disordered. As shown by the dashed line 132 and the two-dot chain line 133, when the quantum well structure is disordered (i.e., the GaInP well layers 120 and the AlGaInP barrier layers 121 have a uniform composition), the band gap of the impurity diffusion region 111 is larger than that of a region in which no impurity is diffused (hereinafter, referred to as "non-impurity region"). For example, in the above structure, a photoluminescence wavelength from the quantum well structure is 650 nm in the non-impurity region, whereas in the impurity diffusion region 111, it is shifted by about 40 nm to 610 nm. In this way, by disordering the quantum well structure, different photoluminescence wavelengths are obtained in the impurity diffusion region 111 and in the non-impurity region. In this case, laser light emitted from the non-impurity region in the active layer 103 is transparent to the impurity diffusion region 111. Therefore, light absorption by the end faces of the cavity is significantly suppressed, and a stable, high-power operation is achieved.

Next, a method for producing the semiconductor laser element 100 according to embodiment 1 of the present invention is described. FIGS. 2A through 2F show steps of the method for producing the semiconductor laser element 100. Throughout the description of the embodiments of the present invention, like reference numerals denote like parts. Moreover, for the purpose of simplifying the description and clarifying features of the present invention, the production method is herein described for one semiconductor element, although a plurality of semiconductor laser elements are produced at one time in the actual production process.

Figure 2A:
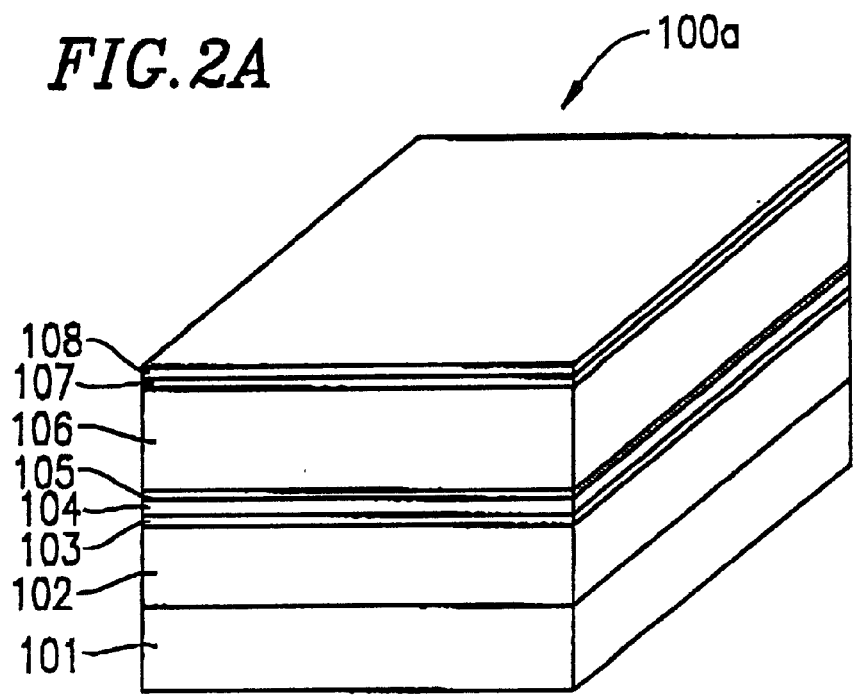
FIGS. 2A through 2F show steps of a method for producing the semiconductor laser element having an end face window structure according to embodiment 1.

In the first step, on an n-type GaAs substrate 101, an n-type AlGaInP cladding layer 102, an active layer 103 which has a quantum well structure, a p-type AlGaInP first cladding layer 104, a p-type GaInP etching stop layer 105, a p-type AlGaInP second cladding layer 106, a p-type GaInP band discontinuity relaxation layer 107, and a p-type GaAs cap layer 108 are sequentially formed by a MOVPE method, thereby obtaining a layered structure 100a having a double hetero structure as shown in FIG. 2A. The p-type GaAs cap layer 108 is of AlGaAs mixed crystals, and acts as a diffusion control film.

Figure 2B:
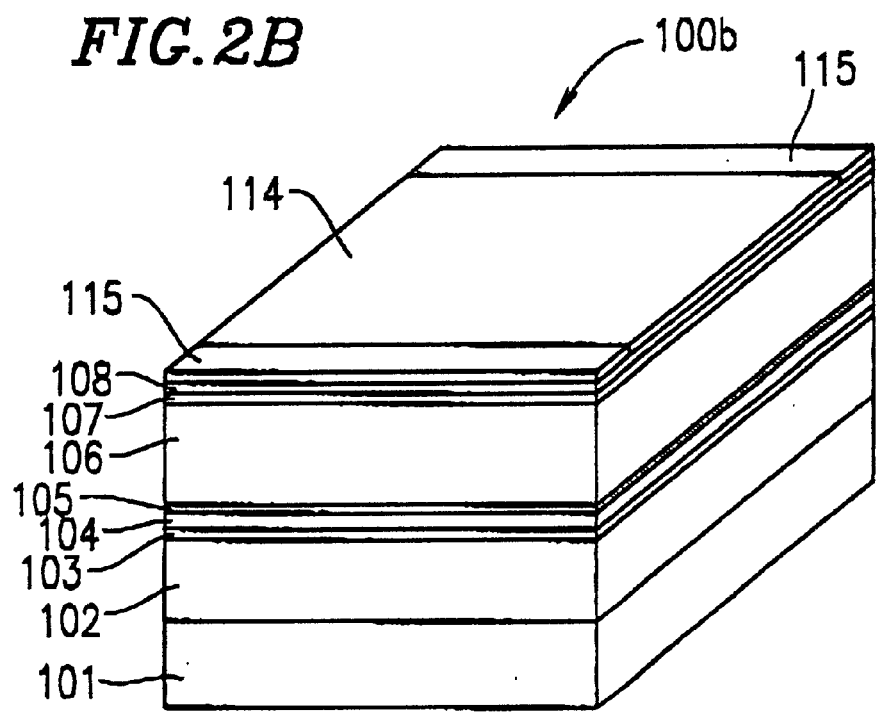

Next, an $SiO_2$ film 114 is formed on the layered structure 100a, and the $SiO_2$ film 114 is patterned by wet etching so as to form stripe opening portions each having a width of 50 $\mu$m at the interval of 700 $\mu$m in a direction perpendicular to a cavity direction of a resulting laser element. Then, a ZnO film 115 is formed by sputtering entirely over the $SiO_2$ film 114 and in the stripe opening portions, and the ZnO film 115 is removed by wet-etching except for part of the ZnO film 115 which has been formed in the stripe opening portions, thereby obtaining a layered structure 100b as shown in FIG. 2B. The ZnO film 115 is a material thin film which acts as an impurity source.

Figure 2C:
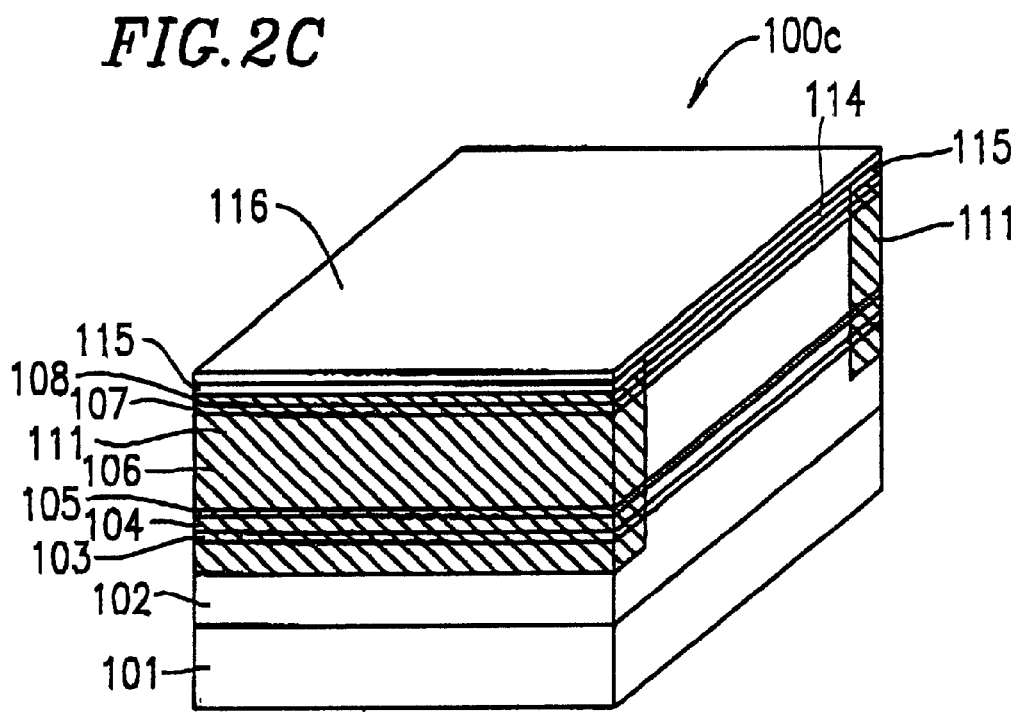

Then, an $SiO_2$ film 116 as a dielectric film is formed entirely over the upper surfaces of the $SiO_2$ film 114 and the ZnO film 115. Thereafter, the resultant structure is annealed in a nitrogen atmosphere. In this annealing process, the ZnO film 115 formed in the stripe opening portions is used as a Zn provision layer to diffuse by solid phase diffusion Zn atoms throughout the layers from the upper surface of the p-type GaAs cap layer 108 down to the n-type AlGaInP cladding layer 102. An result, the impurity diffusion region 111 (shadowed with slanted lines) is formed, whereby a layered structure 100c is obtained as shown in FIG. 2C.

In the impurity diffusion region 111, the active layer 103 having a quantum well structure, which includes the GaInP well layers 120 and the AlGaInP barrier layers 121, is disordered. In the impurity diffusion region 111, the band gap in a disordered portion of the active layer 103 is larger than that in a non-disordered portion, and thus, the disordered portion of the active layer 103 acts as an end face window structure.

Figure 2D:
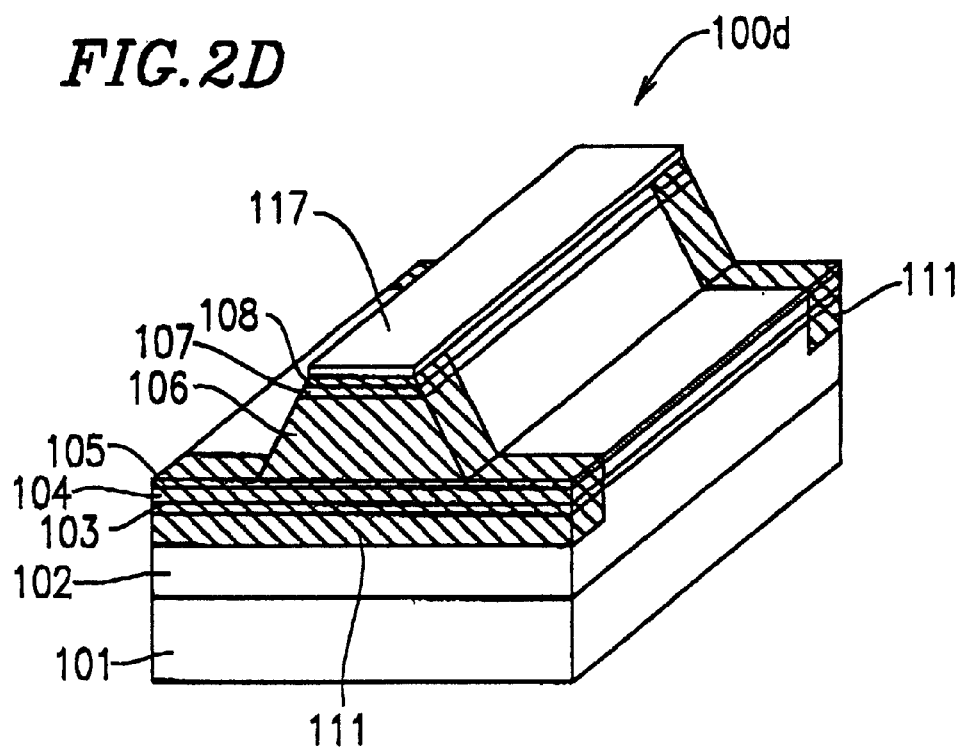

Next, the $SiO_2$ film 114, the ZnO film 115, and the $SiO_2$ film 116 are removed by wet-etching, and an $SiO_2$ film 117 is formed over the upper surface of the resultant structure. The $SiO_2$ film 117 is patterned by wet-etching into a stripe shape having a width of 3 $\mu$m, for example. (As described above, in an actual production process, a plurality of semiconductor laser elements 100 are produced simultaneously, and a plurality of $SiO_2$ films 117 are formed into a stripe pattern so that the longitudinal direction of each stripe is equal to a laser cavity direction.) The $SiO_2$ films 117 are used as a mask to partially remove the p-type GaAs cap layer 108 and the p-type GaInP band discontinuity relaxation layer 107 by wet-etching so as to provide a ridge structure to the p-type GaInP band discontinuity relaxation layer 107 and the p-type GaAs cap layer 108. Then, the p-type AlGaInP second cladding layer 106 is etched with a wet-etching solution which can selectively etch the p-type AlGaInP second cladding layer 106 (e.g., sulfuric acid), so that a ridge-shaped p-type AlGaInP second cladding layer 106 is obtained, whereby a layered structure good is obtained as shown in FIG. 2D. In the layered structure 100d, the p-type GaInP etching stop layer 105 is exposed in regions from which the p-type AlGaInP second cladding layer 106 has been completely removed.

Figure 2E:
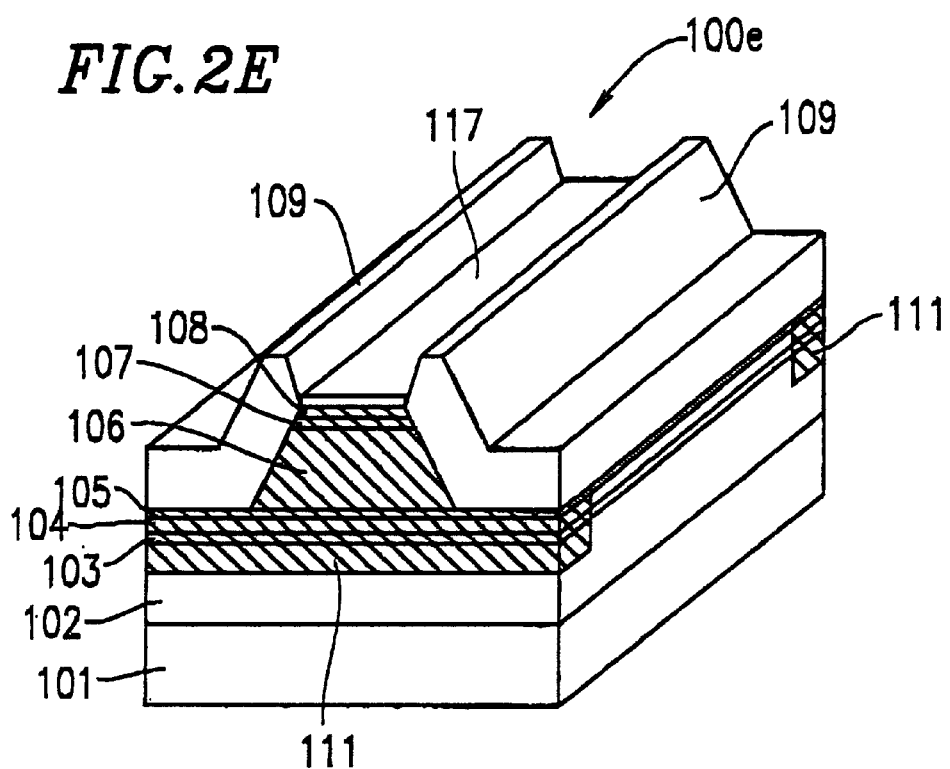

Then, the $SiO_2$ film 117 is also used ad a mask for selective growth to grow, by an MOVPE method, an n-type GaAs current confinement layer 109 on the p-type GaInP etching stop layer 105 so as to cover side surfaces of the p-type AlGaInP second cladding layer 106, the p-type GaInP band discontinuity relaxation layer 107, and the p-type GaAs cap layer 108, thereby obtaining a layered structure 100e as shown in FIG. 2E.

Figure 2F:
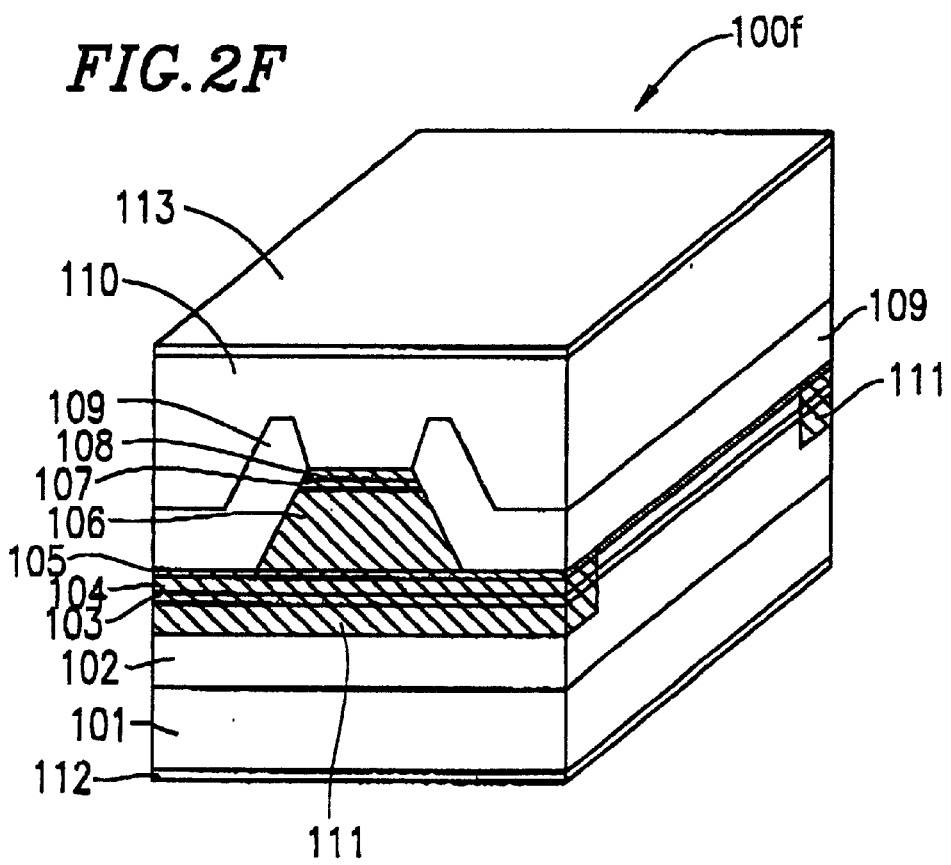

Then, the $SiO_2$ film 117 is removed by wet-etching, and a p-type GaAs contact layer 110 is formed by an MOVPE method over the, entire upper surface of the layered structure 100e from which the $SiO_2$ film 117 has been removed. In the final step, an n-electrode 112 and a p-electrode 113 are formed, thereby obtaining a layered structure 100f as shown in FIG. 2F. In the actual production process, the resultant layered structure is cleaved along a plane in the impurity diffusion region 111 which is perpendicular to the longitudinal direction of the ridge stripes so as to form laser cavities each having a pair of cavity end faces. As a result, a single semiconductor laser element 100 is obtained.

In the semiconductor laser element 100, Zn atoms are diffused as an impurity into the active layer 103 having a quantum well structure, thereby causing the quantum well structure in the impurity diffusion region 111 to be disordered. The disordered quantum well structure acts as an end face window structure. However, an excessive amount of Zn atoms in the quantum well structure increases the amount of free carriers to be absorbed. As a result, increase in operation current and deterioration of reliability are caused. Therefore, it is important to precisely control the diffusion amount of impurities with superior repeatability. Now, a method for controlling the diffusion amount of impurities in the production method according to the present invention is described.

Figure 3:
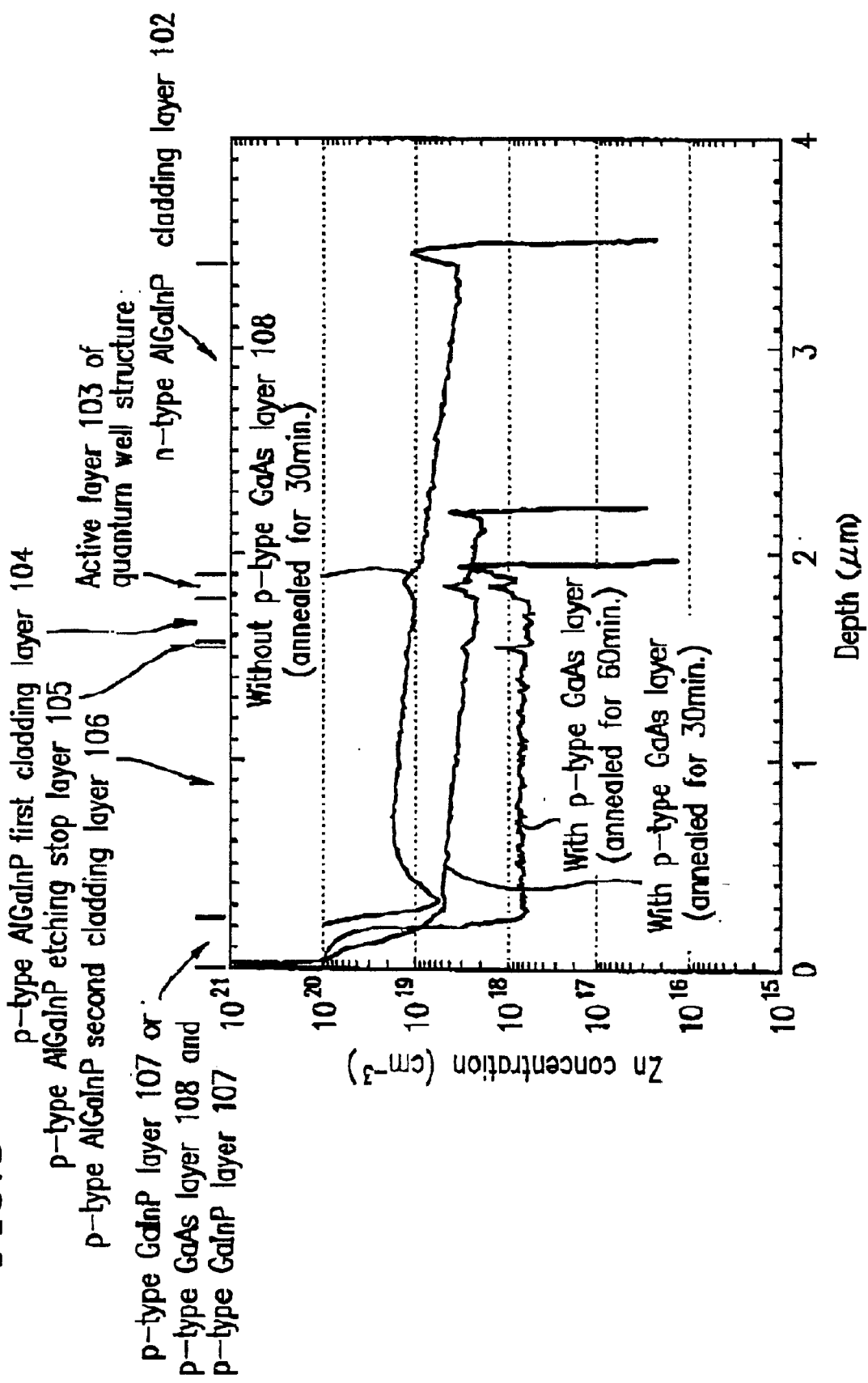
FIG. 3 shows a SIMS profile of Zn atom when Zn atoms are diffused in a double hetero structure in the presence/absence of a GaAs layer.

FIG. 3 shows a SIMS profile of Zn atoms. This SIMS profile shows the diffusion of Zn atoms from the ZnO film 115 into a double hetero structure for the case where the p-type GaAs cap layer 108 having a thickness of 200 nm is formed on the p-type GaInP band discontinuity relaxation layer 107 and the case where the p-type GaAs cap layer 108 1s not formed on the p-type GaInP band discontinuity relaxation layer 107.

In the presence of the p-type GaAs cap layer 108, the annealing temperature when Zn atoms are diffused is about 600° C., and annealing time is about 30 minutes or about 60 minutes. In the absence of the p-type GaAs cap layer 108 (i.e., in the case where only the GaInP layer is present), the annealing temperature is about 600° C., and annealing time is about 30 minutes.

As shown in FIG. 3, in the case without the p-type GaAs cap layer 108, even though the annealing time for diffusion is short (about 30 minutes), about $1 \times 10^{19}$ cm$^{-3}$ or more of Zn atoms are observed in the p-type AlGaInP second cladding layer 106. This is supposed to be because a reaction occurs between the p-type GaInP band discontinuity relaxation layer 107 and the ZnO film 116, whereby interstitial Zn atoms are generated at a high concentration in the p-type GaInP band discontinuity relaxation layer 107 during a short period of time, and these interstitial Zn atoms are immediately diffused into the p-type AlGaInP second cladding layer 106.

In this case, the Zn concentration in the p-type AlGaInP second cladding layer 106 depends on the reaction between the p-type GaInP band discontinuity relaxation layer 107 and the ZnO film 115 rather than the annealing time and the thickness of the p-type GaInP band discontinuity relaxation layer 107. Therefore, in this case, it is difficult to control the diffused Zn concentration.

On the other hand in the presence of the p-type GaAs cap layer 108, no significant reaction occurs between the p-type GaInP band discontinuity relaxation layer 107 and the ZnO film 115. In this case, there is a slow diffusion front in which Zn atoms move by substitution of lattice points and a fast diffusion front in which Zn atoms move through an interstitial area. At the time when the fast diffusion front of low Zn concentration reaches the upper face of the p-type AlGaInP second cladding layer 106, diffusion of Zn atoms into the double hetero structure begins. In this case, by controlling the conductivity type and the thickness of the p-type GaAs cap layer 108, the annealing temperature, and the annealing time, the concentration of Zn atoms diffused into the double hetero structure can be easily controlled.

In particular, according to the present invention, the thickness of the p-type GaAs cap layer 108 is set to about 50 nm to about 300 nm, and/or the annealing temperature is set to about 650° C. or less, preferably, about 500° C. to about 650° C., whereby the Zn concentration in the p-type AlGaInP second cladding layer 106 can be easily controlled in the range from about $8 \times 10^{17}$ cm$^{-3}$ to about As described hereinabove, according to the present invention, the p-type GaAs cap layer 108, which is the impurity source, is provided between the ZnO film 115 and the p-type AlGaInP second cladding layer 106. With such a structure, a low concentration of Zn atoms can be diffused into the p-type AlGaInP second cladding layer 106.

It is preferable to use as a material of a diffusion control thin film in which a diffusion rate of impurities (e.g., Zn atoms) is lower than in the active layer 103. Specifically, a GaAs material may be used as in the p-type GaAs cap layer 108. This is because it is preferable in view of a production readiness that when a GaAs material is used for a substrate of a semiconductor laser element, a diffusion control thin film is made of a GaAs material as in the substrate.

In the case where a GaAs material is employed as a material for the diffusion control thin film, if the p-type AlGaInP second cladding layer 106 includes AlGaAs mixed crystals, the same effect as described above can be obtained regardless of the Al composition. By adjusting the composition of such AlGaAs mixed crystals, the concentration of impurities diffused into the double hetero structure can be controlled.

In view of adherence of the ZnO film 115 to the $SiO_2$ film 116 and the double hetero structure as well as repeatability of Zn diffusion, it is preferable that the thickness of the ZnO film 115, which is a impurity source, is about 50 nm or less. As the impurity source, MgO, ZnSe, etc., may be employed as well as ZnO.

Although the $SiO_2$ film 116 is used as the dielectric film in this embodiment, SiN, $TiO_2$, $Al_2O_3$, etc., may alternatively be used.

Embodiment 2

Hereinbelow, another method for producing the semiconductor laser element 100 is i described. In embodiment 2, the conditions for production are different from those used in embodiment 1.

In embodiment 1, the p-type GaAs cap layer 108 of AlGaAs mixed crystals is used as a diffusion control film to diffuse Zn atoms into the layered structure. Although the production method in embodiment 2 is basically the same as that in embodiment 1, in embodiment 2 the Zn concentration in the p-type AlGaInP second cladding layer 106 is set to about $1 \times 10^{18}$ $cm^{-3}$ or less.

The p-type GaInP etching stop layer 105 as shown in FIG. 1A is absorptive to laser light. Therefore, the thickness of the p-type GaInP etching stop layer 105 is set to a thickness substantially equal to the thickness of each of the GaInP well layers 120 in the active layer 103 of a quantum well structure, i.e., set to about several nanometers to about 20 nm, so that no significant effect is caused on the characteristics of the semiconductor laser element 100. In this structure, when the Zn concentration in the p-type AlGaInP second cladding layer 106 is equal to or more than about $1 \times 10^{18}$ $cm^{-3}$, not only is the active layer 103 disordered, but the p-type GaInP etching stop layer 105 is as well.

The p-type GaInP etching stop layer 105 is provided for stopping the progress of etching, and a material thereof is selected so that the etching selection ratio of the p-type GaInP etching stop layer 105 to the p-type AlGaInP second cladding layer 106 is a high value. However, when the p-type GaInP etching stop layer 105 is disordered, the etching selection ratio significantly deteriorates. As a result, the function of the p-type GaInP etching stop layer 105 for stopping the progress of etching is weakened.

In such a case, in the impurity diffusion region 111, the p-type GaInP etching stop layer 105 is completely removed, and accordingly, the p-type AlGaInP first cladding layer 104 is also removed by etching together with the p-type GaInP etching stop layer 105. As a result, it becomes difficult to control the shape of the ridge, so that the width of the ridge in the impurity diffusion region 111 is different from that in the non-impurity region. In such a structure, optical loss in the waveguide formed by the ridge structure such as coupling loss can increase. This causes problems, such as an Increase in the operation current, variation in the light spreading angle, etc.

In order to avoid such disadvantages, it is important to promote disordering of the active layer 103 without weakening the function of the p-type GaInP etching stop layer 105. Hereinafter, the preferable disordering of the active layer 103 according to embodiments of the present invention will be described in detail.

The present inventor(s) found that when the Zn concentration in the p-type AlGaInP second cladding layer 106 is set to about $1 \times 10^{18}$ $cm^{-3}$ or less, disordering of the p-type GaInP etching stop layer 105 is suppressed, whereas Zn atoms are accumulated in the active layer 103 at a concentration of about $2 \times 10^{18}$ $cm^{-3}$, and disordering of the active layer 103 is promoted therein, whereby an end face window structure which can be applied to a practical use is obtained.

In the case where the GaInP well layers 120 in the active layers 103 are formed so that each of the GaInP well layers 120 has a thickness of about 7 nm or less, and the p-type GaInP etching stop layer 105 is formed so as to have a thickness of about 9 nm to about 15 nm, disordering of the active layers 103 and the etching stopping function of the p-type GaInP etching stop layer 105 are satisfactorily achieved without impairing the characteristics of the semiconductor laser element 100.

Furthermore, in the case where the p-type GaAs cap layer 108 is formed so as to have a thickness of about 200 nm, and the annealing conditions are set such that the annealing temperature is about 600° C. and the annealing time is 30 minutes, the resulting Zn concentration in the p-type AlGaInP second cladding layer 106 is about $9 \times 10^{17}$ $cm^{-3}$, and the Zn concentration in the active layer 103 is about $2 \times 10^{18}$ $cm^{-3}$. In this case, composition change is observed in the interface of the p-type GaInP etching stop layer 105, but a completely disordered state cannot be obtained. If etching is performed in such a state, the p-type GaInP etching stop layer 105 is not completely etched, that is, etching can be stopped at the p-type GaInP etching stop layer 105.

Embodiment 3

Figure 4:
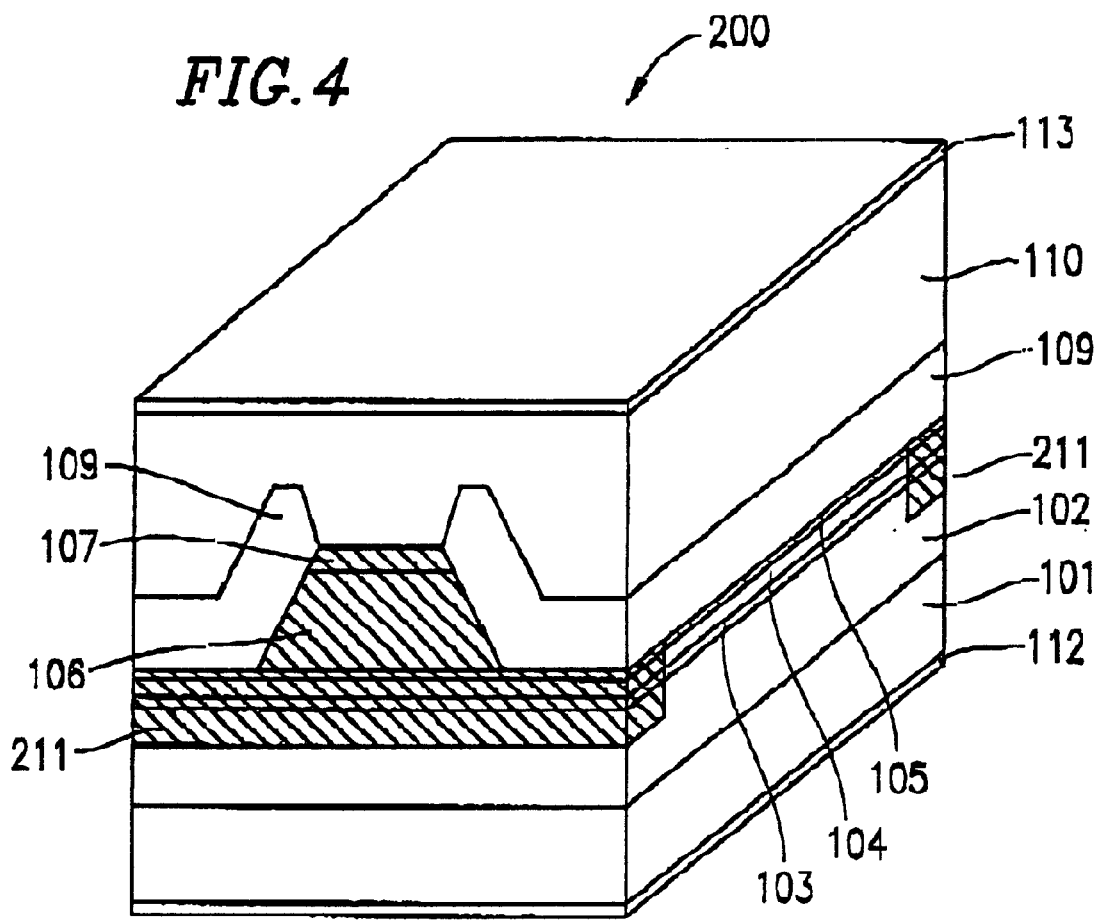
FIG. 4 shows a semiconductor laser element having an end face window structure according to embodiment 3 of the present invention.

A semiconductor laser element 200 according to embodiment 3 of the present invention and a production method thereof are described. FIG. 4 is a perspective view of the semiconductor laser element 200. The semiconductor laser element 200 is a high-power AlGaInP red semiconductor laser element of a lateral mods control type, which has an end face window structure.

The structure of the semiconductor laser element 200 is the same as that of the semiconductor laser element 100 according to embodiments 1 and 2 (FIG. 1), except that the semiconductor laser element 200 does not have a p-type GaAs cap layer 108.

In the production process of the semiconductor laser element 100 according to embodiments 1 and 2, the $SiO_2$ film 117, which is used as a mask in the step of etching the p-type AlGaInP second cladding layer 106 so as to have a ridge shape, is formed on the p-type GaAs cap layer 108 in which Zn atoms are diffused at a high concentration (FIG. 2D). According to embodiment 3, the $SiO_2$ film 117 is formed after the p-type GaAs cap layer 108 has been removed.

In the production process of the semiconductor laser element 100 according to embodiments 1 and 2, the p-type GaAs cap layer 108 is not removed. Such a structure where the p-type GaAs cap layer 108 in which Zn atoms are diffused at a high concentration is left in the structure is advantageous for promoting the diffusion of Zn atoms into the active layer 103, and therefore promoting the disordering of the active layer 103 in the step of growing the n-type GaAs current confinement layer 109 on the side surfaces of the p-type AlGaInP second cladding layer 106 having a ridge shape (FIG. 2E) and in the step of growing the p-type GaAs contact layer 110 on the entire upper surface of the layered structure (FIG. 2F).

However, the presence of the p-type GaAs cap layer 108 may be a cause for abnormal etching in the lateral direction of the p-type AlGaInP second cladding layer 106. Accordingly, it may sometimes be difficult to obtain a desired ridge width with high repeatability. Thus, by removing the p-type GaAs cap layer 108 prior to etching the p-type AlGaInP second cladding layer 106 into a ridge shape, repeatability of the ridge width can be significantly improved.

The production process for the semiconductor laser element 200 according to embodiment 3 of the present invention is the substantially the same as the process for the semiconductor laser element 100 described in embodiment 1 until the layered structure 100c is completed (FIG. 2C). Thus, description of the steps before the layered structure 100c is completed is omitted below.

Figure 5A:
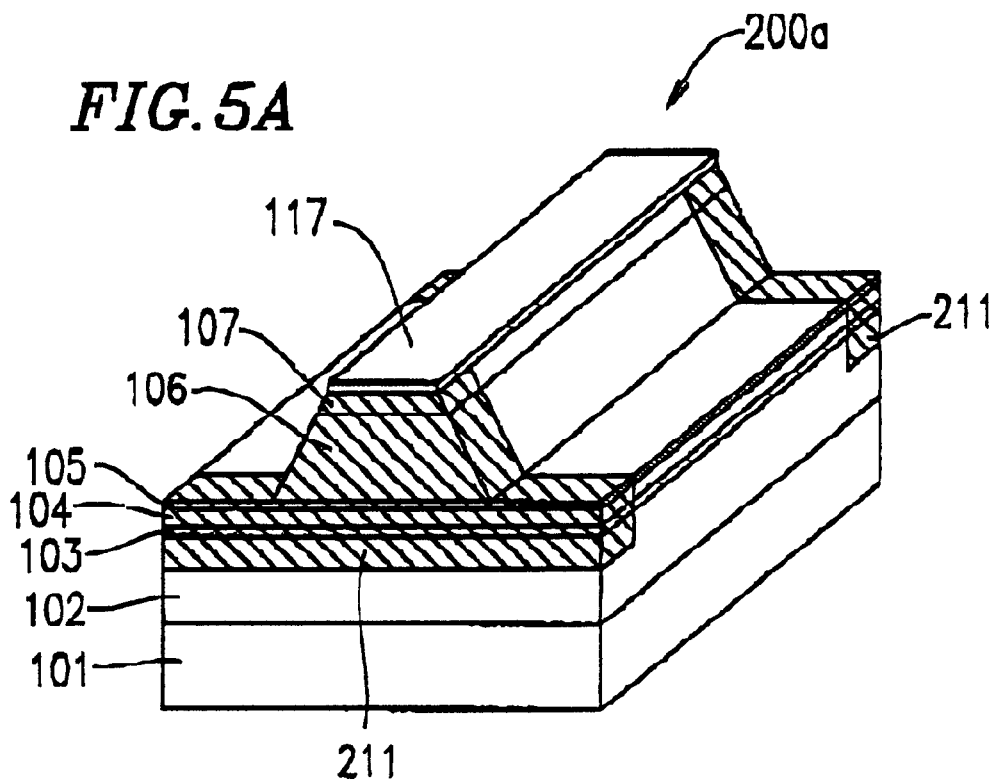
FIGS. 5A through 5C show steps of a method for producing the semiconductor laser element having an end face window structure according to embodiment 3.

According to embodiment 3, after the layered structure. 100c (FIG. 2C) has been obtained, the $SiO_2$ film 114, the ZnO film 115, the $SiO_2$ film 116, and the p-type GaAs cap layer 108 of the layered structure 100c are removed by etching, and subsequently, an $SiO_2$ film 117 in formed over the exposed upper surface of the p-type GaInP band discontinuity relaxation layer 107. The $SiO_2$ film 117 is patterned by wet-etching into a stripe shape having a width of about 3 μm, for example. (In an actual production process, a plurality of semiconductor laser elements 200 are produced simultaneously, and a plurality of $SiO_2$ films 117 are formed into a stripe pattern so that the longitudinal direction of each stripe is equal to a laser cavity direction.) The $SiO_2$ films 117 is used as a mask to partially remove the p-type GaInP band discontinuity relaxation layer 107 by wet-etching so as to provide a ridge structure to the p-type GaInP band discontinuity relaxation layer 107. Then, the p-type AlGaInP second cladding layer 106 is etched with a wet-etching solution which can selectively etch the p-type AlGaInP second cladding layer 106 (e.g., sulfuric acid), so that a ridge-shaped p-type AlGaInP second cladding layer 106 is obtained, whereby a layered structure 200a is obtained as shown in FIG. 5A. In the layered structure 200a, the p-type GaInP etching stop layer 105 is exposed in regions from which the p-type AlGaInP second cladding layer 106 has been completely removed.

Figure 5B:
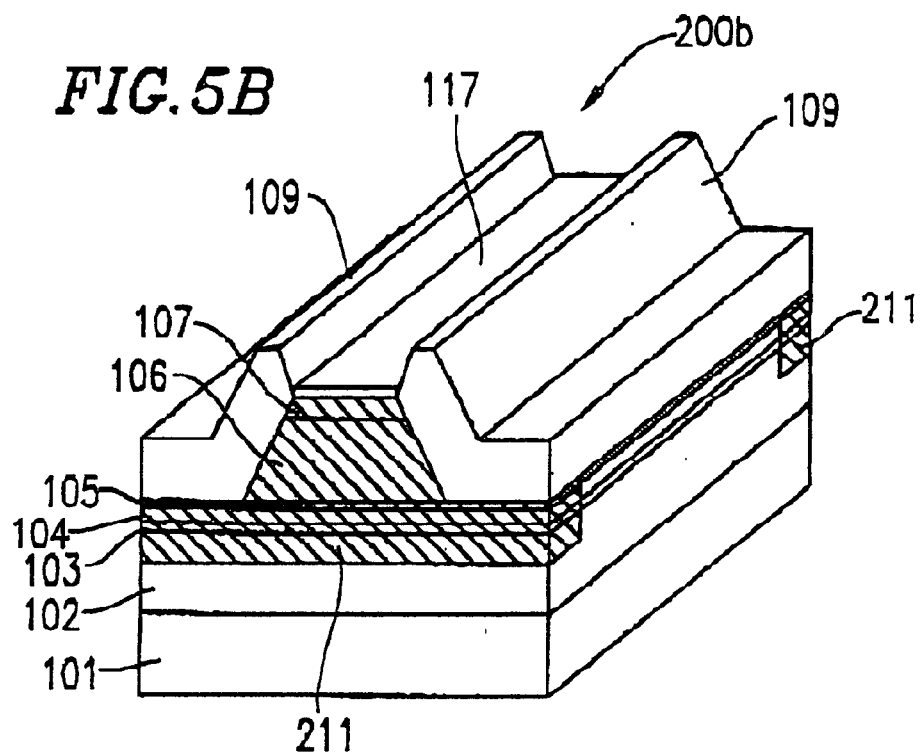

Then, the $SiO_2$ film 117 is also used as a mask for selective growth to grow, by an MOVPE method, an n-type GaAs current confinement layer 109 on the p-type GaInP etching stop layer 105 so as to cover side surfaces of the p-type AlGaInP second cladding layer 106 and the p-type GaInP band discontinuity relaxation layer 107, thereby obtaining a layered structure 200b as shown in FIG. 5B.

Figure 5C:
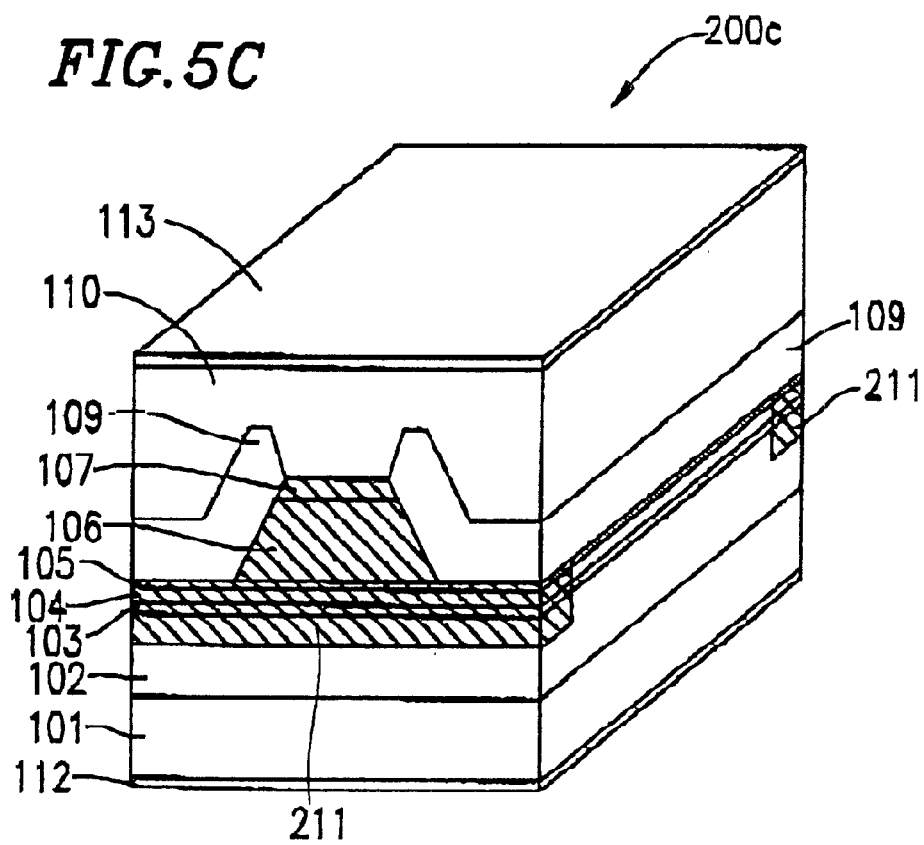

Then, the $SiO_2$ film 117 is removed by wet-etching, and a p-type GaAs contact layer 110 is formed by an MOVPE method over the entire upper surface of the layered structure 200b from which the $SiO_3$film 117 has been removed. In the final step, an n-electrode 112 and a p-electrode 113 are formed, thereby obtaining a layered structure 200c as shown in FIG. 5C. In the actual production process, the resultant layered structure is cleaved along a plane in the impurity diffusion region 211 which is perpendicular to the longitudinal direction of the ridge stripes so as to form laser cavities each having a pair of cavity end faces. As ma result, a single semiconductor laser element 200 is obtained.

Embodiment 4

Hereinafter, another method for producing the semiconductor laser element 200 is described. In embodiment 4, the conditions for production are different from those used in embodiment 3.

In embodiments 1 and 2, the conductivity type of the p-type GaAs cap layer 108 is p-type. This is to facilitate injection of a current into the non-impurity region. Also in embodiment 3, the conductivity type of the p-type GaAs cap layer 108 is p-type. However, since the p-type GaAs cap layer 108 is removed by etching after the diffusion of Zn atoms in embodiment 3, the conductivity type of the p-type GaAs cap layer 108 is not limited to p-type.

The production method of the semiconductor laser element 200 according to embodiment 4 is substantially the same as the production method according to embodiment 3, except that an n-type GaAs cap layer 108' or an undoped GaAs cap layer 108" is used as a diffusion control thin film in place of the p-type GaAs cap layer 108.

As in embodiment 3, the n-type GaAs cap layer 108' or the undoped GaAs cap layer 108" is removed by etching after Zn atoms have been diffused. Thus, in the final step, the semiconductor laser element 200 shown in FIG. 4 is also obtained in embodiment 4.

The only difference between the production methods according to embodiments 3 and 4 is that a material used for the diffusion control thin film is different. Thus, a detailed description of the method for producing the semiconductor laser element 200 in embodiment 4 is omitted.

Referring to FIG. 3, the diffusion rate of Zn atoms significantly decreases in the n-type AlGaInP cladding layer 102, and the Zn concentration sharply decreases at the diffusion front in the n-type AlGaInP cladding layer 102. This is assumed to be because in an n-type semiconductor layer in which electrons are present (i.e., the n-type. AlGaInP cladding layer 102), interstitial Zn atoms are entrapped by lattice points, and the entrapped Zn atoms hardly move. In general, in a region wherein the number of electrons is large, that is, the carrier concentration is high, Zn atoms are likely to be entrapped by lattice points. Thus, Zn concentration at the diffusion front can be readily controlled by adjusting the carrier concentration in the n-type semiconductor layer. Such an entrapment phenomenon also occurs in an AlGaAs mixed crystal region In a similar manner.

Thus, the higher mode of Zn diffusion is suppressed by using the n-type GaAs cap layer 108', and the Zn concentration at the diffusion front can be freely controlled by adjusting the carrier concentration in the n-type GaAs cap layer 108'. As a result, the concentration of Zn atoms diffused in the double hetero structure can be controlled with high precision. When the n-type GaAs cap layer 108' is used, the thickness thereof is preferably from about 50 nm to about 300 nm, and the annealing temperature is preferably from about 500° C. to about 650° C.

Alternatively, although the diffusion control effect of the undoped GaAs cap layer 108" is staller than that of the n-type GaAs cap layer 108", the Zn concentration can be readily controlled with the undoped GaAs cap layer 108" as compared with the n-type GaAs cap layer 108'.

Embodiment 5

Figure 6:
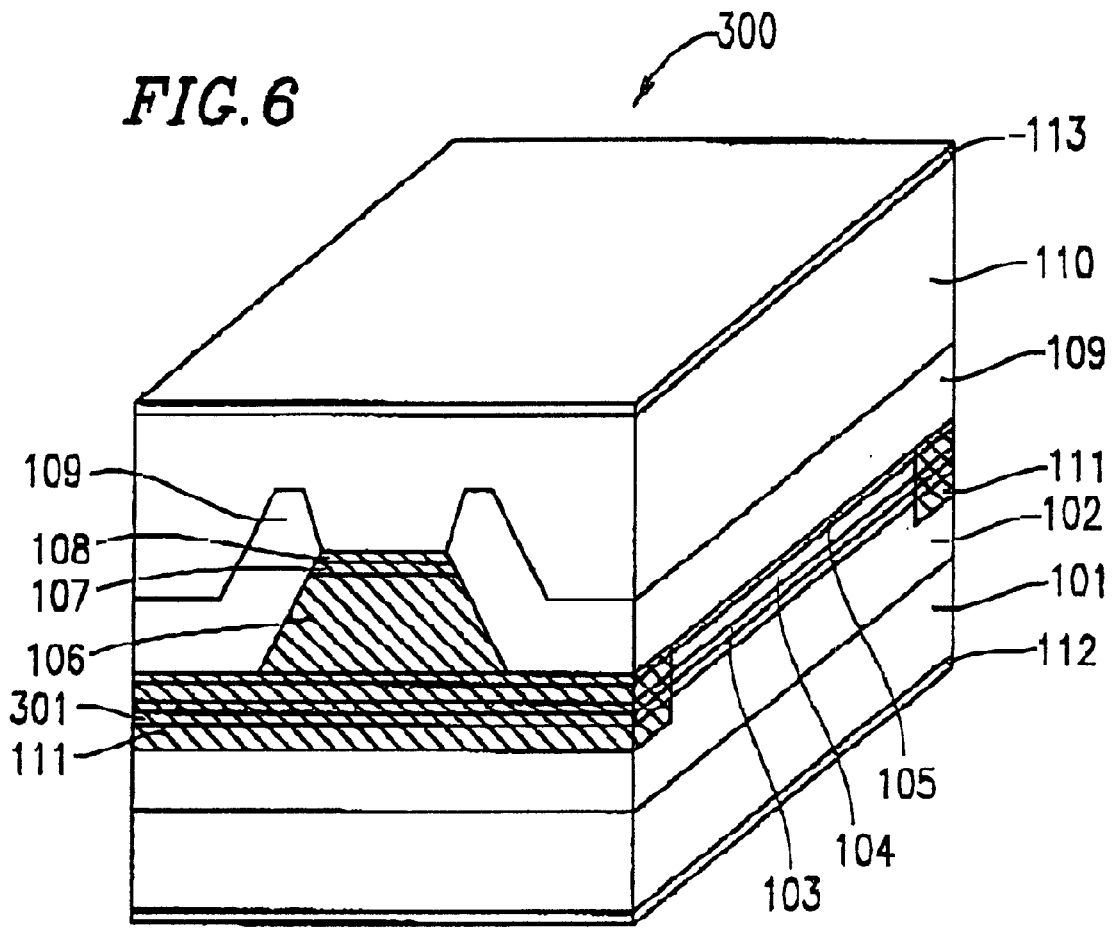
FIG. 6 shows a semiconductor laser element having an end face window structure according to embodiment 5 of the present invention.

A semiconductor laser element 300 according to embodiment 5 of the present invention and a production method thereof are described. FIG. 6 is a perspective view of the semiconductor laser element 300. The semiconductor laser element 300 is a high-power AlGaInP red semiconductor laser element of a lateral mode control type, which has an end face window structure.

In the semiconductor laser elements 100 (FIG. 1A) and 200 (FIG. 4), the active layer 103 is formed so as to be in contact with the n-type AlGaInP cladding layer 102. On the other hand, according to embodiment 5, in the semiconductor laser element 300, an undoped AlGaInP layer 301 is provided between the n-type AlGaInP cladding layer 102 and the active layer 103. The thickness of the undoped AlGaInP layer 301 is equal to or more than about 40 nm. The other parts of the semiconductor laser element 300 are the same as those of the semiconductor laser element 100. Moreover, the p-type GaAs cap layer 108 may be removed during the production process thereof as in the production process of the semiconductor laser element 200, i.e., the semiconductor laser element 300 may not include the p-type GaAs cap layer 108 in the final step.

For example, an undoped AlGaInP layer 301 having a thickness of about 50 nm is provided between the n-type AlGaInP cladding layer 102 and the active layer 103, Zn atoms are diffused quickly until they reach the n-type AlGaInP cladding layer 102. Accordingly, the Zn diffusion progresses further than in the case where the undoped AlGaInP layer 301 is not provided, so that Zn atoms reach a lower part of, the double hetero structure.

Zn atoms are further diffused toward the lower part of the double hetero structure, whereby the active layer 103 is further disordered. As a result, even when the Zn concentration in the p-type AlGaInP second cladding layer 106 is the same whether of not the undoped AlGaInP layer 301 is provided, the disordering of the active layer 103 Is promoted as compared to the case where the undoped AlGaInP layer 301 is not provided. Accordingly, the function of the impurity diffusion region 111 as an end face window structure is improved.

Such an effect is notable especially when the thickness of the undoped AlGaInP layer 301 is equal to or more than 50 nm. The maximum thickness of the undoped AlGaInP layer 301 is not limited to a particular thickness, but it is preferably about 200 nm or less.

The production method of the semiconductor laser element 300 according to embodiment 5 is substantially the same as the production method of the semiconductor laser element 100 according to embodiment 1 which has been described with reference to FIGS. 2A through 2B, except that the undoped AlGaInP layer 301 is provided between the n-type AlGaInP cladding layer 102 and the active layer 103.

FIGS. 7A through 7F show steps of the method for producing the semiconductor laser element 300. In the first step, on an n-type GaAs substrate 101, an n-type AlGaInP cladding layer 102, an undoped AlGaInP layer 301, an active layer 103 which has a quantum well structure, a p-type AlGaInP first cladding layer 104, a p-type GaInP etching, stop layer 105, a p-type AlGaInP second cladding layer 106, a p-type GaInP band discontinuity relaxation layer 107, and a p-type GaAs cap layer 108 are sequentially formed by a MOVPE method, thereby obtaining a layered structure 300a having a double hetero structure an shown in FIG. 7A.

Figure 7A:
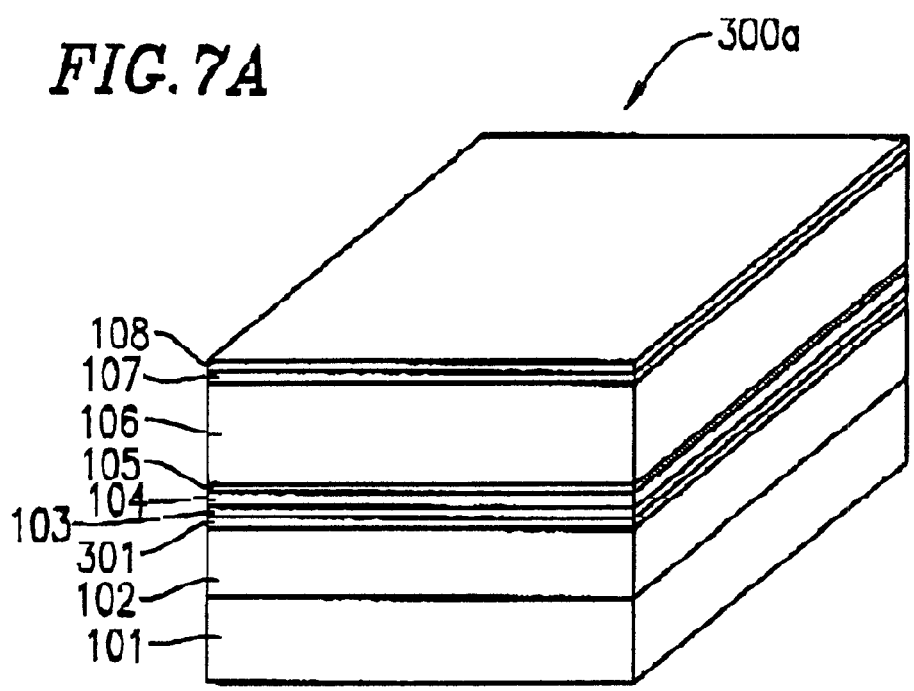
FIGS. 7A through 7F show steps of a method for producing the semiconductor laser element having an end face window structure according to embodiment 5.
Figure 7B:
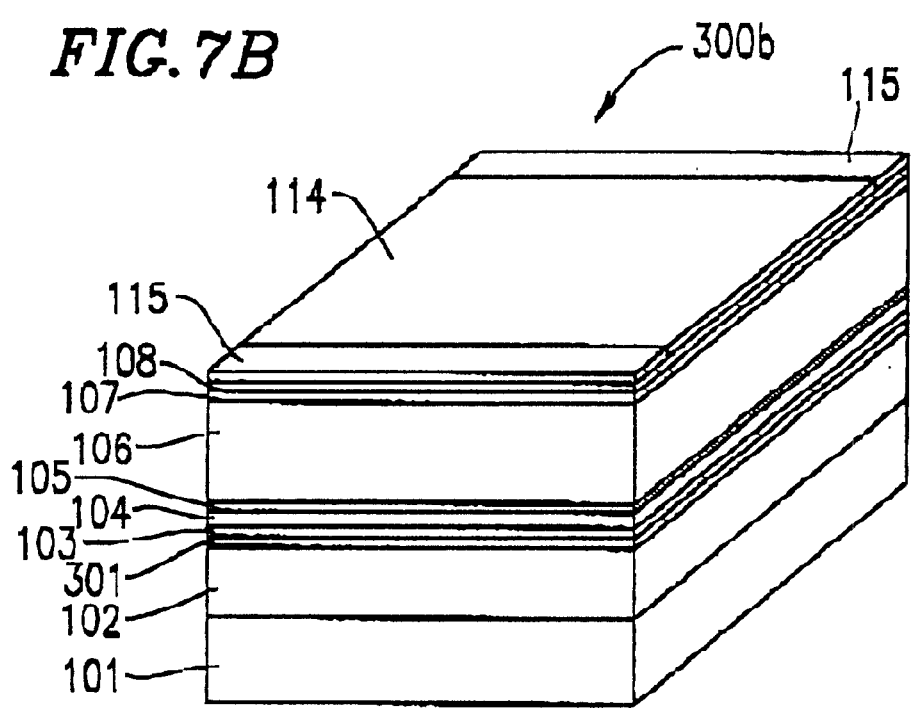

Next, a layered structure 300b is produced as shown in FIG. 7B in the similar manner as described for the formation of the layered structure 100b (FIG. 2B).

Figure 7C:
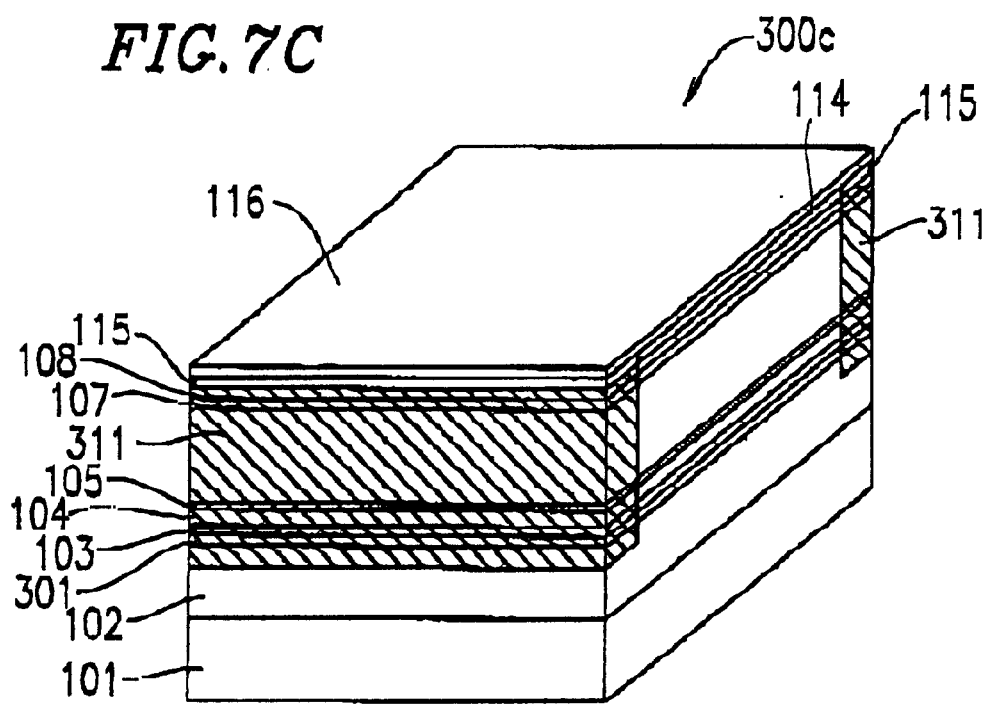

Then, an SiO$_2$ film 116 as a dielectric film is formed entirely over the upper surfaces of the SiO$_2$ film 114 and the ZnO film 115. Thereafter, the resultant structure is annealed in a nitrogen atmosphere. In this annealing process, the ZnO film 115 formed in the stripe opening portions is used as a Zn provision layer to diffuse Zn atoms throughout the layers from the upper surface of the p-type GaAs cap layer 108 down to the n-type AlGaInP cladding layer 102. As a result, the impurity diffusion region 311 is formed, whereby a layered structure 300c is obtained as shown in FIG. 7C.

Figure 7D:
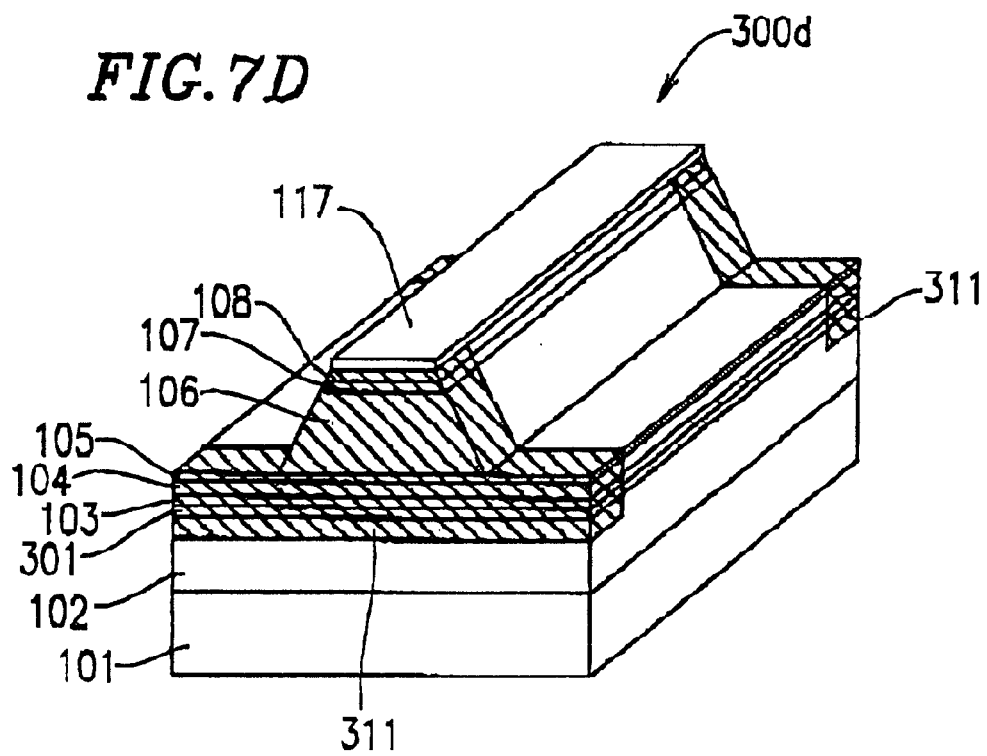

Next, a layered structure 300d is produced as shown in FIG. 7D in the similar manner as described for the formation of the layered structure 100d (FIG. 2D).

Figure 7E:
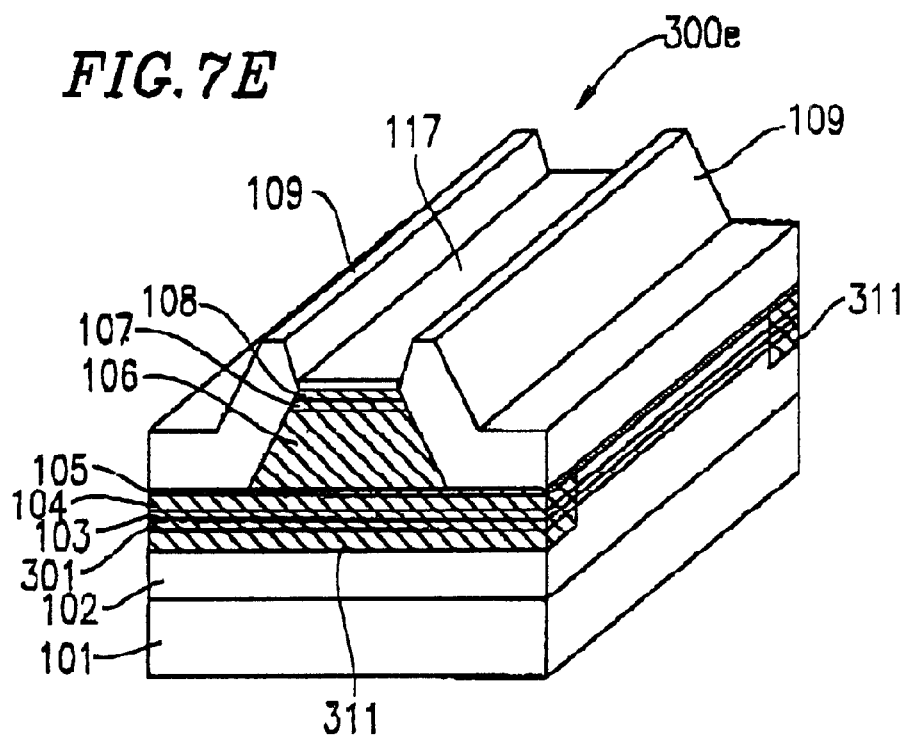

Next, a layered structure 300e is produced as shown in FIG. 7E in the similar manner as described for the formation of the layered structure 100e (FIG. 2E).

Figure 7F:
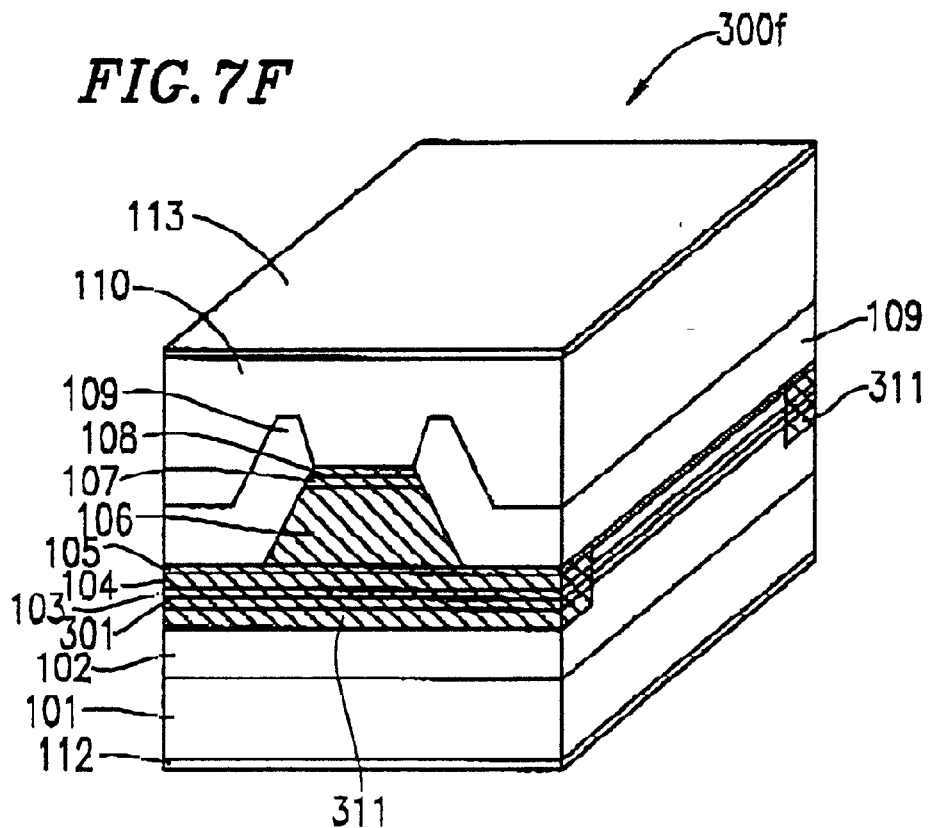

Next, a layered structure 300f is produced as shown in FIG. 7F in the similar manner as described for the formation of the layered structure 100f (FIG. 2F). In an actual production process, the resultant layered structure is cleaved along a plane in the impurity diffusion region 311 which is perpendicular to the longitudinal direction of the ridge stripes so as to form laser cavities each having a pair of cavity end faces. As a result, a single semiconductor laser element 300 is obtained.

Embodiment 6

Figure 8A:
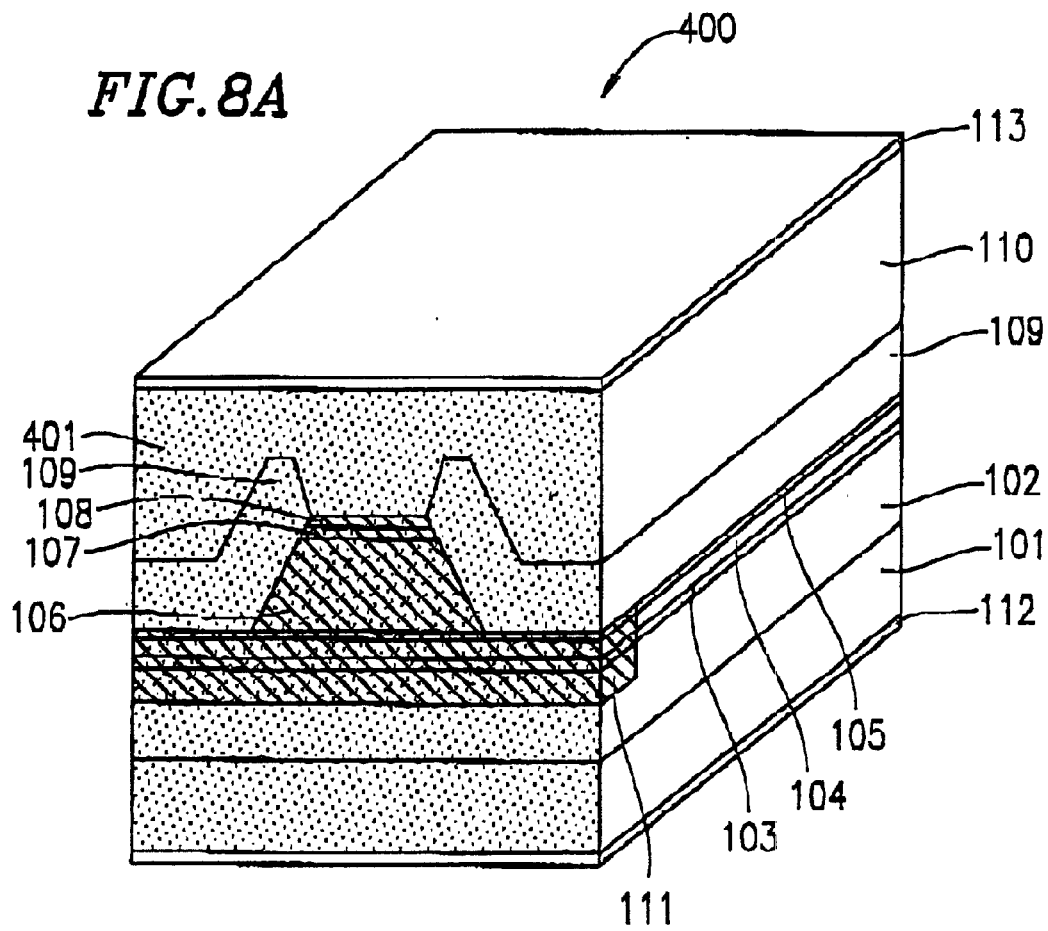
FIG. 8A shows a semiconductor laser element having an end face window structure according to embodiment 6 of the present invention.

A semiconductor laser element 400 according to embodiment 6 of the present invention and a production method thereof are described. FIG. 8A is a perspective view of the semiconductor laser element 400. The semiconductor laser element 400 is a high-power AlGaInP red semiconductor laser element of a lateral mode control type, which has an end face window structure.

The semiconductor laser element 100 (FIG. 1A) has impurity diffusion regions 111 in both cavity end faces. According to embodiment 4, the semiconductor laser element 400 has an impurity diffusion region 111 only in a cavity end face from which the laser light is actually emitted. A low reflective coating film 401 is attached to the cavity end face at the laser emission side (dotted face in FIG. 8A). The reflectance of the low reflective coating film 401 may be several percent (e.g., 4%). The other cavity end face may be provided with a high reflective coating film (not shown). The reflectance of the high reflective coating film may be about 80–90%.

In such a semiconductor laser element 400 with an asymmetric coating on its end faces, crystal breakage occurs only in the end face on which a low reflectance coating film is applied. Thus, according to embodiment 6, the impurity diffusion region 111 is formed in the end face in which crystal breakage occurs. The impurity diffusion region 111 contains a high concentration of Zn, optical loss due to absorption of free carriers is non-negligible, and accordingly, a decrease of optical output or an increase of operation current is caused. In the semiconductor laser element 400, the impurity diffusion region 111 is formed only in a required area of the end faces, whereby a decrease of optical output or an increase of operation current can be suppressed.

The production process for the semiconductor laser element 400 according to embodiment 6 of the present invention is substantially the same as the process for the semiconductor laser element 100 described in embodiment 1 up until the layered structure 100a is completed (FIG. 2A). Thus, a description of the steps before the layered structure 100a is completed is omitted below.

According to embodiment 6, after the layered structure 100a shown in FIG. 2A is completed, an SiO$_2$ film 114 is formed on the layered structure 100a, and the SiO$_2$ film 114 is patterned by wet etching so as to form opening portions each having a width of about 50 µm in a direction perpendicular to a cavity direction of a resulting laser element.

Then, a ZnO film 115 is formed by sputtering entirely over the SiO$_2$ film 114 and in the opening portions, and the ZnO film 115 is removed by wet-etching except for part of the ZnO film 115 which has been formed in the opening portions, thereby obtaining a layered structure 400b as shown in FIG. 8B.

Figure 8C:
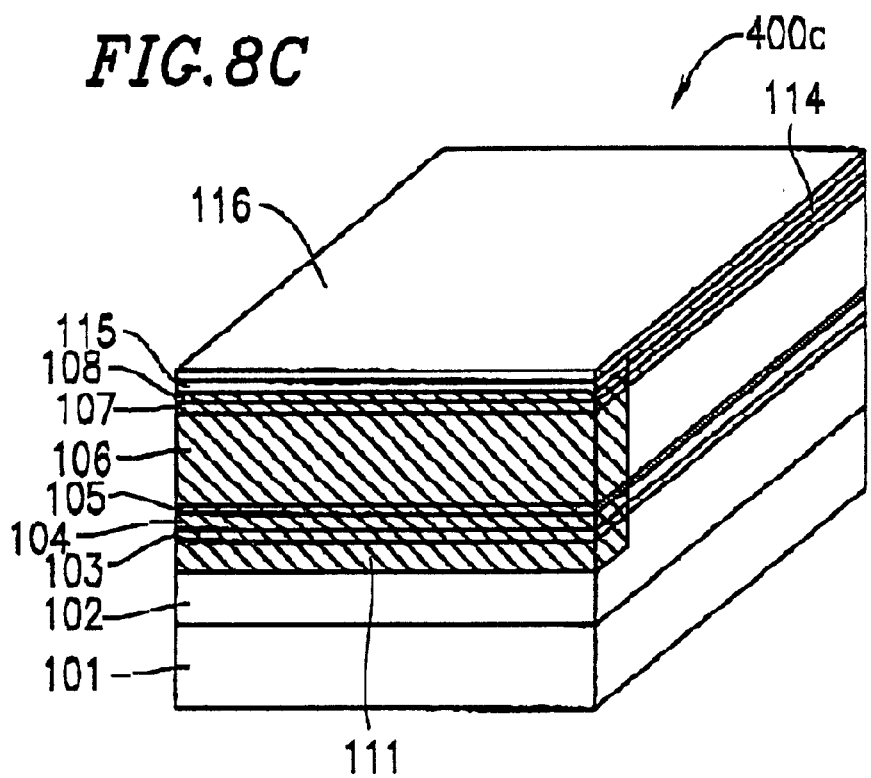

Then, an SiO$_2$ film 116 as a dielectric film is formed entirely over the upper surfaces of the SiO$_2$ film 114 and the ZnO film 115. Thereafter, the resultant structure is annealed in a nitrogen atmosphere. In this annealing process, the ZnO film 115 formed in the opening portions is used as a Zn provision layer to diffuse Zn atoms throughout the layers from the upper surface of the p-type GaAs cap layer 108 down to the n-type AlGaInP cladding layer 102. As a result, the impurity diffusion region 111 (shadowed with slanted lines) is formed, whereby a layered structure 400c is obtained as shown in FIG. 8C.

Figure 8D:
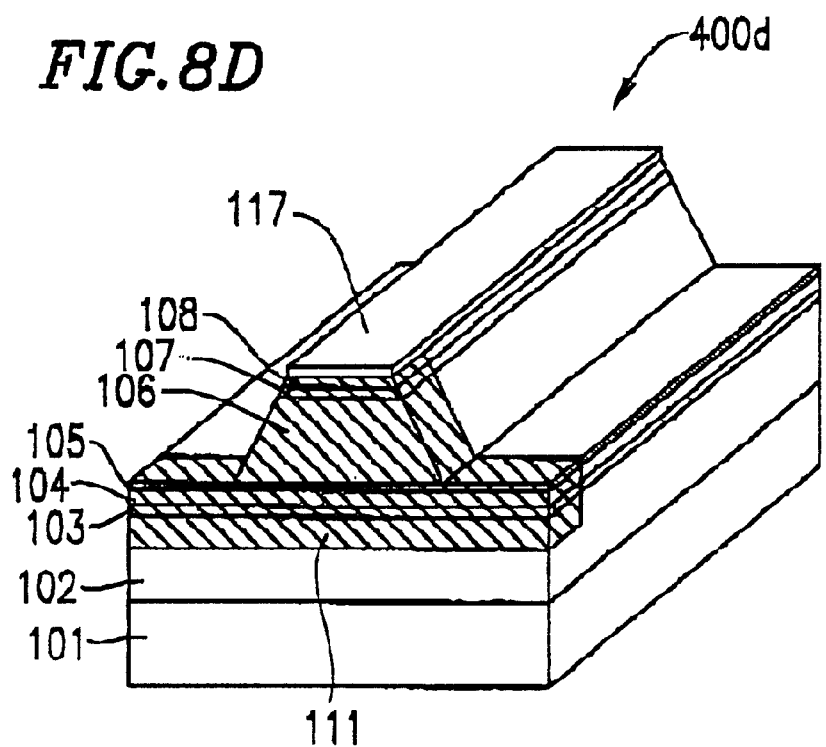
Figure 8E:
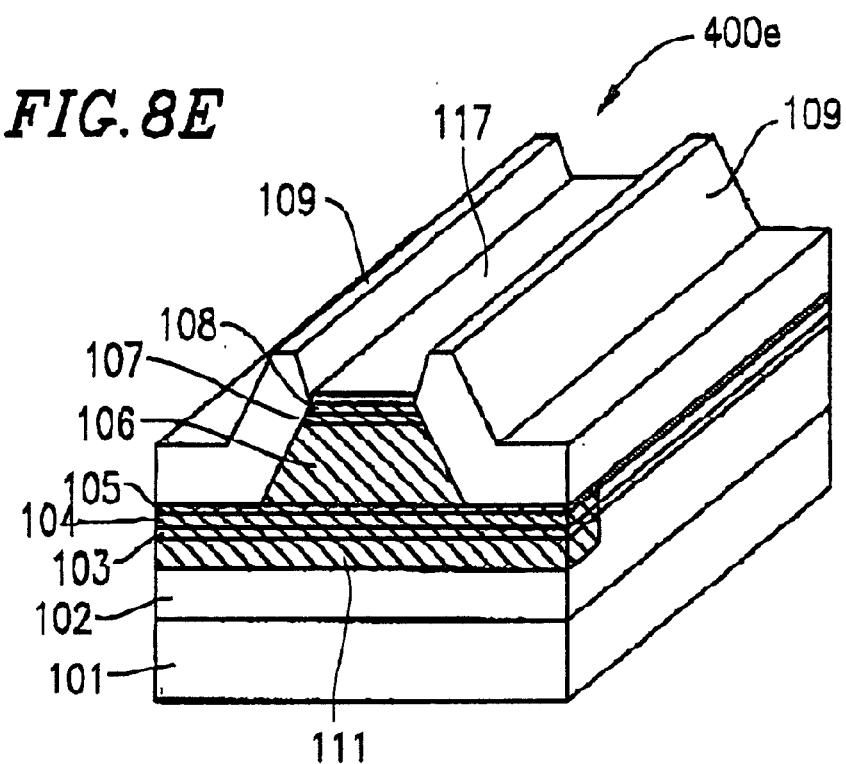
Figure 8F:
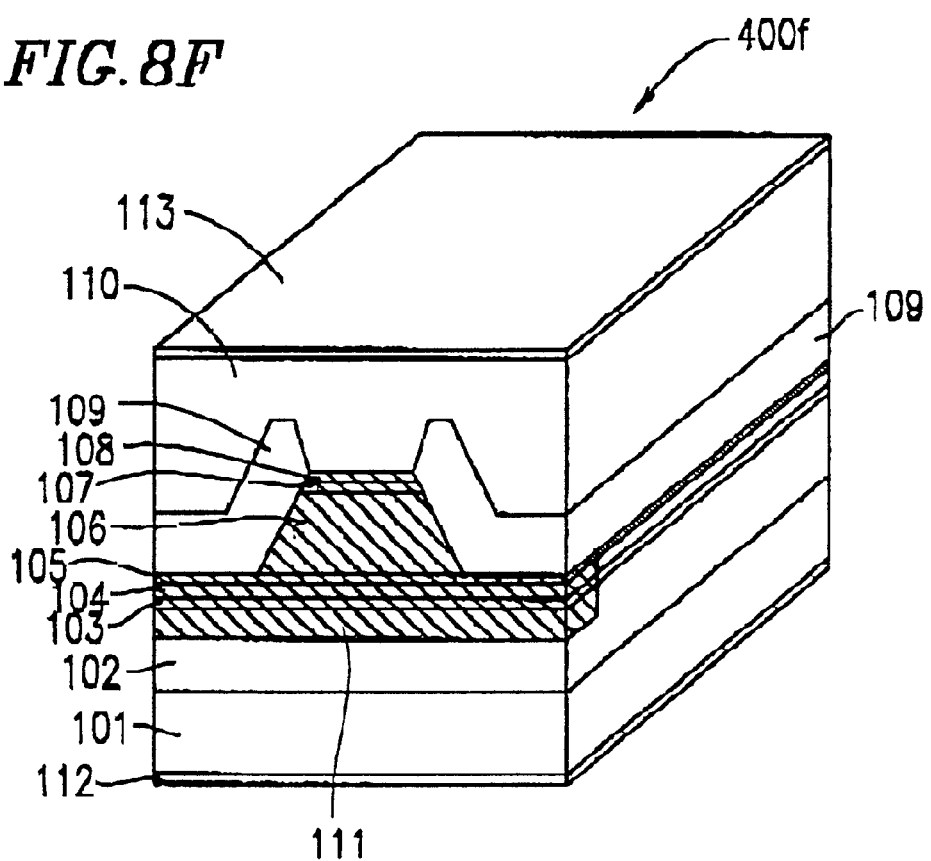

After the layered structure 400c is completed, layered structures 400d, 400e, and 400f respectively shown in FIGS. 8D, 8E, and 8F are formed. The steps of forming the layered structures 400d, 400e, and 400f are the same as the steps of forming the layered structures 100d, 100e, and 100f respectively shown in FIGS. 2D, 2E, and 2F. Thus, the description of the production steps of forming the layered structures 400d, 400e, and 400f is omitted below.

According to the production method of the semiconductor laser element 400 according to embodiment 6, after a cleaving process, a pair of opposite end surfaces of the layered structure 400f shown in FIG. 8F are provided with the low reflective coating film 401 and a high reflective coating film formed thereon, respectively, whereby the semiconductor laser element 400 is completed.

Embodiment 7

Hereinafter, another method for producing the semiconductor laser element 100 is described. In embodiment 7, the conditions for production are different from those used in embodiment 1.

According to embodiment 1, the annealing step is performed only before the step of etching the p-type AlGaInP second cladding layer 106, the p-type GaInP band discontinuity relaxation layer 107, and the p-type GaAs cap layer 108 so as to obtain a ridge shape. According to embodiment 7, another annealing step is provided after the step of growing the n-type GaAs current confinement layer 109 (described in embodiment 1 in relation to FIG. 2E).

As described in embodiment 2, in the case where the Zn concentration in the p-type AlGaInP second cladding layer 106 is limited to a value meal to or smaller than about $1 \times 10^{18}$ cm$^{-3}$, if the active layer 103 does not have a preferable thickness, a sufficiently disordered state may not be obtained in the active layer 103 by a single annealing step. Thus, according to embodiment 7, a plurality of annealing steps are provided in the production process, whereby disordering of the active layer 103 is promoted. Furthermore, according to embodiment 7, the following effects can be obtained.

Figure 9:
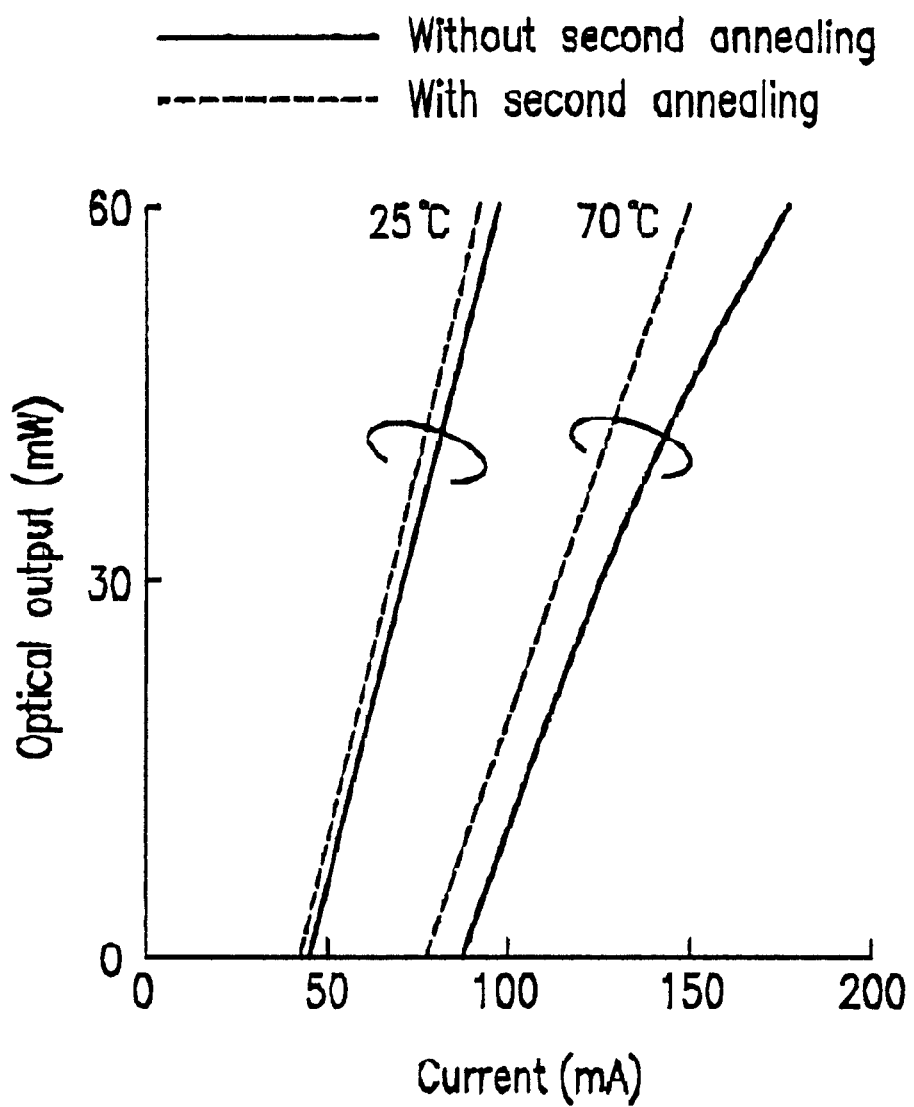
FIG. 9 shows a comparison result of a current-optical output characteristic in the case where a second annealing is/is not performed.

FIG. 9 shows exemplary current-optical output characteristics for a case where a second annealing is performed in a nitrogen atmosphere at about 600° C. and for a case where a second annealing is not performed. FIG. 9 shows that the second annealing reduces the Iop (i.e. operating current) under a high temperature condition (about 70° C). This is assumed to be because hydrogen infiltrated into the double hetero structure during the epitaxial growth step is removed by the second annealing.

Embodiment 8

A semiconductor laser element 500 according to embodiment 8 of the present invention and a production method thereof are described. FIG. 10 is a perspective view of the semiconductor laser element 500. The semiconductor laser element 500 is a high-power AlGaInP red semiconductor laser element of a lateral mode control type, which has an end face window structure.

In the production process of the semiconductor laser element 100 according to embodiment 1 (FIGS. 2A through 2F), the impurity diffusion regions 111 are formed before the steps of forming the p-type AlGaInP second cladding layer 106, the p-type GaInP band discontinuity relaxation layer 107, and the p-type GaAs cap layer 108.

According to embodiment 8, in order to solve problems associated with etching non-uniformity caused in the steps of forming the p-type AlGaInP second cladding layer 106, the p-type GaInP band discontinuity relaxation layer 107, and the p-type GaAs cap layer 108, an impurity diffusion region 502 is formed after a ridge structure of these layers is formed.

As shown in FIG. 10, the semiconductor laser element 600 includes an n-type GaAs substrate 101, an n-type AlGaInP cladding layer 102, an active layer 103 which has a quantum well structure, a p-type AlGaInP first cladding layer 104, a p-type GaInP etching stop layer 105, a p-type AlGaInP second cladding layer 106, a p-type GaInP band discontinuity relaxation layer 107, a p-type GaAs cap layer 108, an n-type GaAs current confinement layer 109, a p-type GaAs contact layer 110, an n-electrode 112, and a p-electrode 513. As shown in FIG. 1B, the active layer 103 includes a plurality of GaInP well layers 120 and a plurality of AlGaInP barrier layers 121.

Referring again to FIG. 10, the p-type AlGaInP second cladding layer 106 is formed into a ridge shape, whereby lateral mode control of laser light is achieved. Moreover, an impurity diffusion region 502, which is an end face window structure of an end face of the laser element 500, is formed by a solid phase diffusion of Zn atoms.

Now, the production method of the semiconductor laser element 500 is described. FIGS. 11A through 11F show steps of producing the semiconductor laser element 500.

Figure 11A:
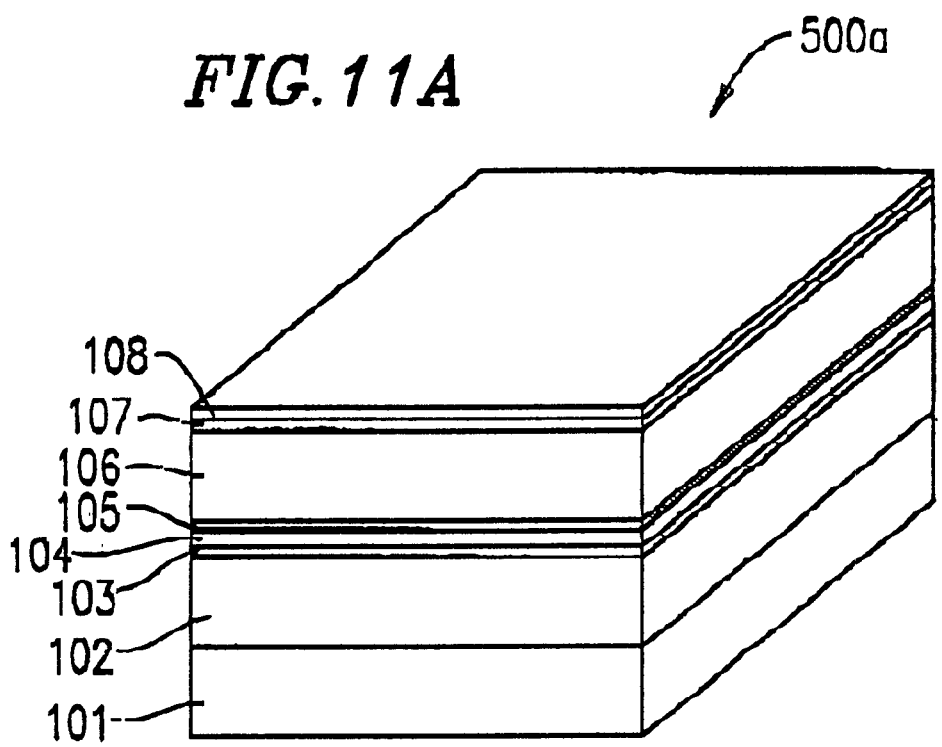

In the first step, on an n-type GaAs substrate 101, an n-type AlGaInP cladding layer 102, an active layer 103 which has a quantum Well structure, a p-type AlGaInP first cladding layer 104, a p-type GaInP etching stop layer 105, a p-type AlGaInP second cladding layer 106, a p-type GaInP band discontinuity relaxation layer 107, and a p-type GaAs cap layer 108 are sequentially formed by an MOVPE method, thereby obtaining a layered structure 500a having a double hetero structure as shown in FIG. 11A.

Figure 11B:
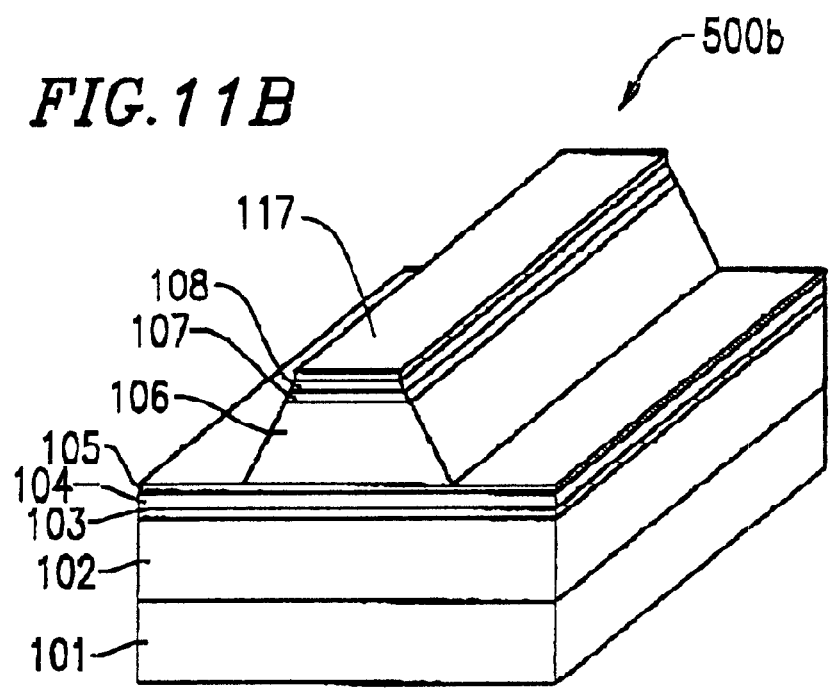

Next, an SiO$_2$ film 117 is formed over the upper surface of the layered structure 500a. The SiO$_2$ film 117 is then patterned by wet-etching into a stripe shape having a width of several micrometers, for example. (As described above, in an actual production process, a plurality of semiconductor laser elements 500 are produced simultaneously, and a plurality of SiO$_2$ films 117 are formed into a stripe pattern so that the longitudinal direction of each stripe is equal to a laser cavity direction.) The SiO$_2$ films 117 is used as a mask to partially remove the p-type GaAs cap layer 108 and the p-type GaInP band discontinuity relaxation layer 107 by wet-etching so as to provide a ridge structure to the p-type GaAs cap layer 108 and the p-type GaInP band discontinuity relaxation layer 107. Then, the p-type AlGaInP second cladding layer 106 is etched with a wet-etching solution which can selectively etch the p-type AlGaInP second cladding layer 106 (e.g., sulfuric acid), so that a ridge-shaped p-type AlGaInP second cladding layer 106 is obtained, whereby a layered structure 500b is obtained as shown in FIG. 11B. In the layered structure 500b, the p-type GaInP etching stop layer 105 is exposed in regions from which the p-type AlGaInP second cladding layer 106 has been completely removed.

Figure 11C:
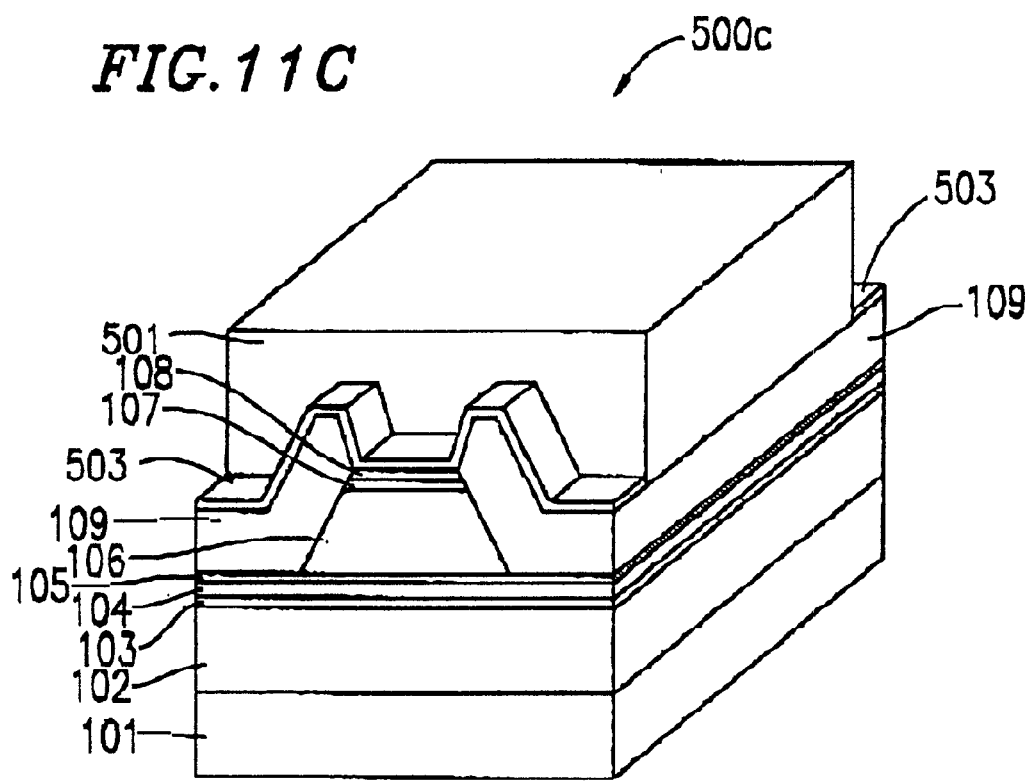

Then, the $SiO_2$ film 117 is also used as a mask for selective growth to grow, by an MOVPE method, an n-type GaAs current confinement layer 109 on the p-type GaInP etching stop layer 105 so as to cover side surfaces of the p-type AlGaInP second cladding layer 106, the p-type GaInP band discontinuity relaxation layer 107, and the p-type GaAs cap layer 106. Thereafter, the $SiO_2$ film 117 is removed by wet-etching. Then, an $SiO_2$ film is formed again, and is patterned by wet-etching so as to form stripsshaped $SiO_2$ films 603 each having a width of about 50 μm at an interval of about 700 μm in a direction perpendicular to a cavity direction of a resulting laser element. Subsequently, a p-type GaAs contact layer 501 Is selectively formed by an MOVPE method over the entire upper surface of the p-type GaAs cap layer 108 and the n-type GaAs current confinement layer 109 except over the $SiO_2$ films 503, whereby a layered structure 500c is obtained as shown in FIG. 11C.

Figure 11D:
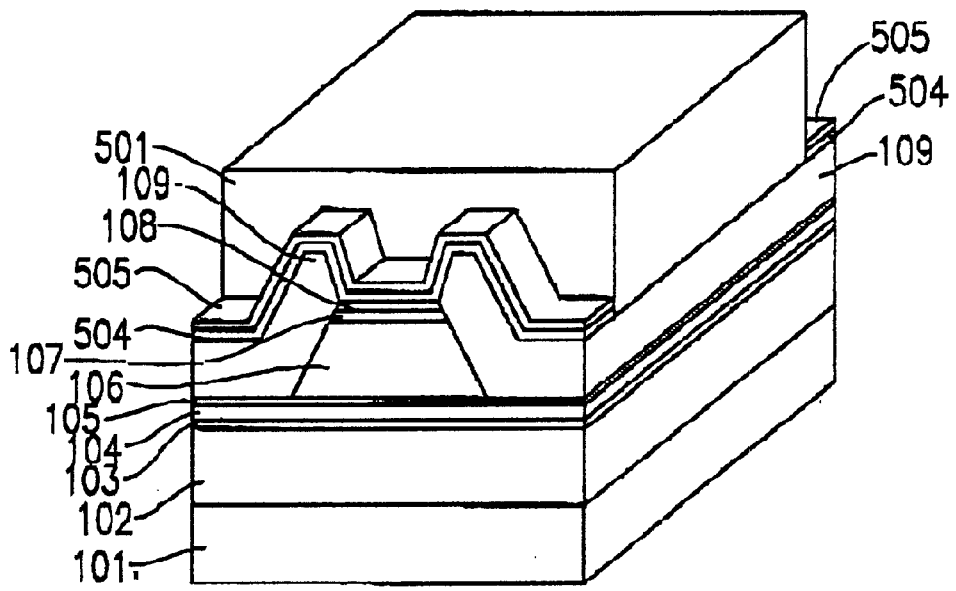

Next, the $SiO_2$ films 503 are removed by wet-etching. Then, a $SiO_2$ film (not shown) is formed entirely over the p-type GaAs cap layer 108, the n-type GaAs current confinement layer 109, and the p-type GaAs contact layer 501, and this $SiO_2$ film is patterned by wet-etching so that the $SiO_2$films left only over the p-type GaAs contact layer 501. Then, opening portions are formed in areas in which the p-type GaAs contact layer 501 is not formed. Then, a ZnO film 504 is formed over the p-type GaAs cap layer 108, the n-type GaAs current confinement layer 109, and the $SiO_2$ film formed over the p-type GaAs contact layer 501. Subsequently, the $SiO_2$ film and the ZnO film 504 formed over the p-type GaAs contact layer 501 are removed except in the opening portions. In addition, a $SiO_2$ film 505 is formed in the opening portions, whereby a layered structure 5004 is obtained as shown in FIG. 11D.

Then, the resultant structure is annealed in a nitrogen atmosphere. In this annealing process, the ZnO film 504 is used as a Zn provision layer to diffuse Zn atoms throughout the layers from the upper surface of the p-type GaAs cap layer 108 up to the n-type AlGaInP cladding layer 102, As a result, the impurity diffusion region 502 (shadowed with slanted lines in FIG. 11E) is formed.

In the impurity diffusion region 502, the active layer 103 having a quantum well structure, which includes the GaInP well layers 120 and the AlGaInP barrier layers 121, is disordered. Furthermore, the active layer 103 may include a p-types GaInP etching stop layer 105. In the impurity diffusion region 502, the band gap in a disordered portion of a quantum well is larger than that in a non-disordered portion, and thus, the disordered portion of the quantum well acts as an end face window structure.

Figure 11E:
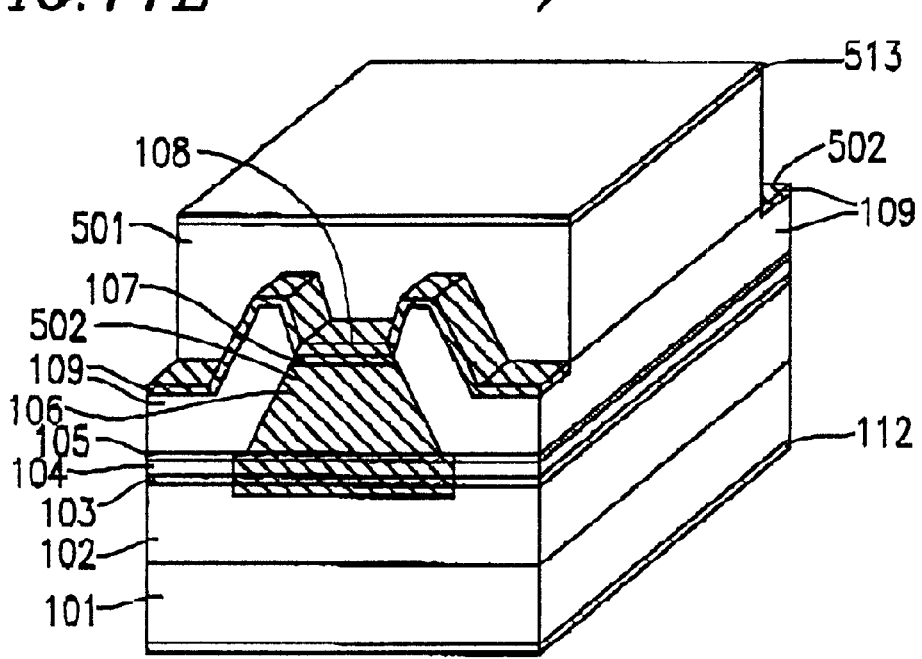

Next, the ZnO film 504 and the $SiO_2$ film 505 are removed by wet-etching. Then, an n-electrode 112 and a p-electrode 513 are formed, thereby obtaining a layered structure 500e as shown in FIG. 11E. In an actual production process, the resultant layered structure is cleaved along a plane in the impurity diffusion region 502 which is perpendicular to the longitudinal direction of the ridge stripes so as to form laser cavities. As a result, a single semiconductor laser element 500 is obtained.

Referring again to FIG. 10, in the semiconductor laser element 500, p-type layers (the p-type GaInP band discontinuity relaxation layer 107 and the p-type GaAs cap layer 108) are provided over the upper surface of the ridge-shaped p-type AlGaInP second cladding layer 106. In addition, at the sides of the p-type layers, n-type layers (the n-type GaAs current confinement layer 109) are provided. The present inventors found that in the p-type layers, Zn atoms diffused so that they reach the active layer 103, whereas in the n-type layers, the diffusion rate of Zn atoms significantly decreases as described in embodiment 4. In an experiment performed by the present inventors, Zn atoms pass through the n-type layers in about one hour by annealing at about 600° C. On the other hand, Zn atoms pass through the p-type layers in 5 minutes by annealing at about 600° C. That Is, the diffusion rate in the n-type layers is $\frac{1}{12}$ of the diffusion rate in the p-type layers. Such a slow diffusion rate enables selective diffusion of Zn atoms while maintaining the current confinement effect. Note that a limited area in the vicinity of the upper surface of the n-type GaAs current confinement layer 109 in which Zn atoms are diffused forms a part of the impurity diffusion region 502.

As described hereinabove, according to embodiment 8, an end face window structure can be readily formed without weakening the current confinement effect at the side faces of the p-type AlGaInP second cladding layer 106. Although increase in optical loss in the waveguide formed by the ridge structure due to the absorption of free carriers is non-negligible because Zn atoms are contained in the end face window structure at a high concentration, an unnecessary current which does not contribute to laser emission can be reduced because an AlGaInP layer in the end face window structure is inactive.

Embodiment 9

Figure 12:
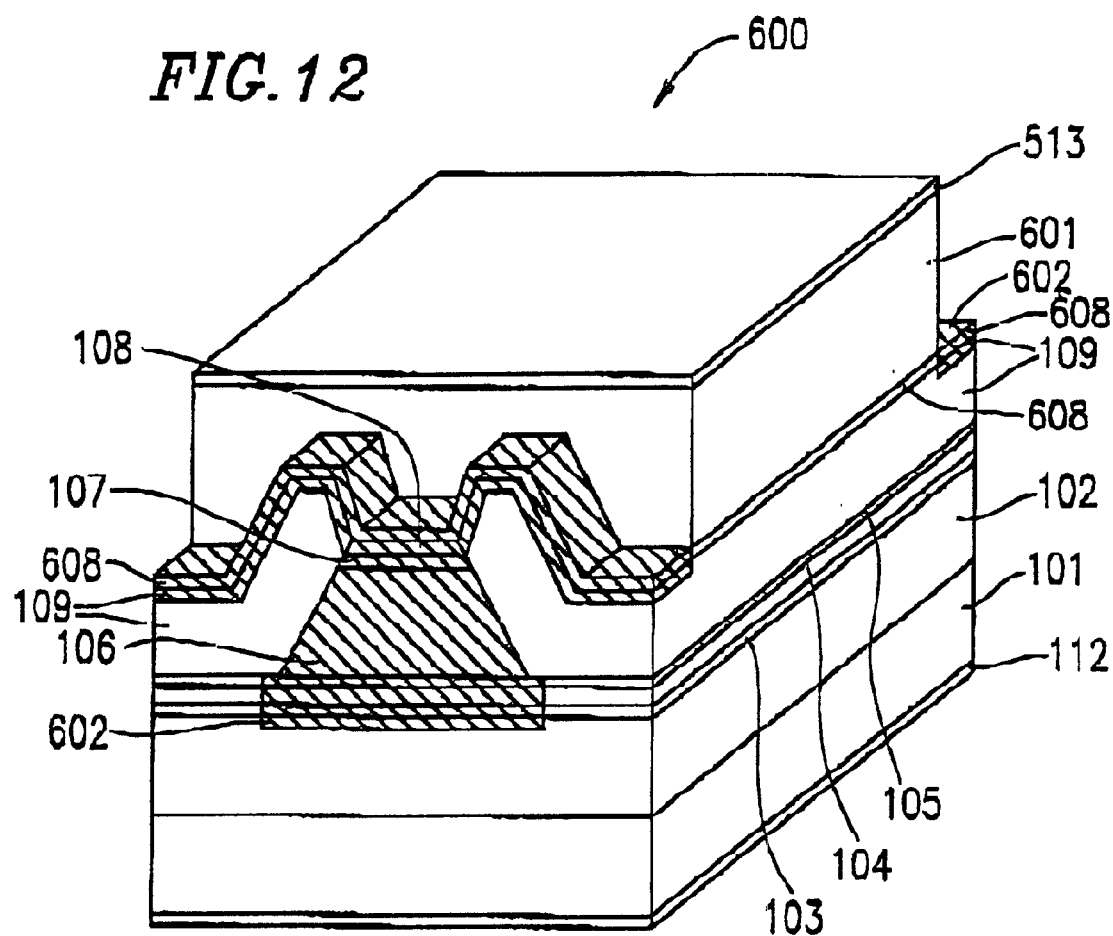
FIG. 12 shows a semiconductor laser element having an end face window structure according to embodiment 9 of the present invention.

A semiconductor laser element 600 according to embodiment 9 of the present invention and a production method thereof are described. FIG. 12 is a perspective view of the semiconductor laser element 600. The semiconductor laser element 600 is a high-power AlGaInP red semiconductor laser element of a lateral mode control type, which has an end face window structure.

The structure of the semiconductor laser element 600 is the same as that of the semiconductor laser element 500 according to embodiment 8 (FIG. 10), except that in the semiconductor laser element 600, a AlGaAs mixed crystal layer 608 is formed entirely over the p-type GaAs cap layer 108 and the n-type GaAs current confinement layer 109, the p-type GaAs contact layer 601 is formed over the AlGaAs mixed crystal layer 608, and an impurity diffusion region 602 includes part of the AlGaAs mixed crystal layer 608. Hereinafter, the production method of the semiconductor laser element 600 according to embodiment 9 is described.

The production method of the semiconductor laser element 600 is the same as the production method of the semiconductor laser element 500 up until the layered structure 500b (FIG. 11B) is completed. Therefore, description of the production steps before the completion of the layered structure 500b is omitted below.

Figure 13A:
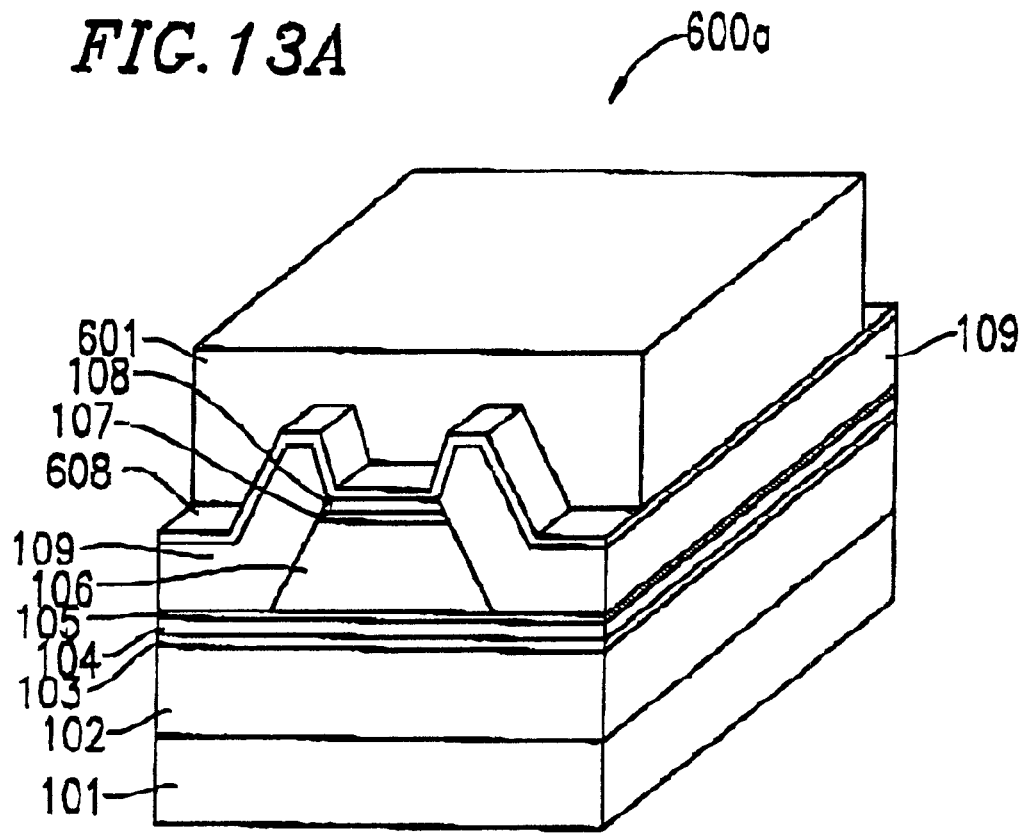
FIGS. 13A through 13C show steps of a method for producing the semiconductor laser element having an end face window structure according to embodiment 9.

In the production method of the semiconductor laser element 500, the p-type GaAs contact layer 501 is selectively formed by using the $SiO_2$ films 503 as a selection mask, whereby the layered structure 500c shown in FIG. 11C is obtained. On the other hand, in the production method of the semiconductor laser element 600, after the layered structure 500b (FIG. 11B) is completed, SiO₂ films 503 are not formed, but an AlGaAs mixed crystal layer 608 and a p-type GaAs contact layer 601 are formed over the entire upper surface of the n-type GaAs current confinement layer 109. Then, part of the p-type GaAs contact layer 601 over a region in which the impurity diffusion region 602 (FIG. 12) is to be formed is selectively removed by wet-etching, whereby a part of the AlGaAs mixed crystal layer 608 is exposed, and a layered structure 600a is obtained as shown in FIG. 13A.

Figure 13B:
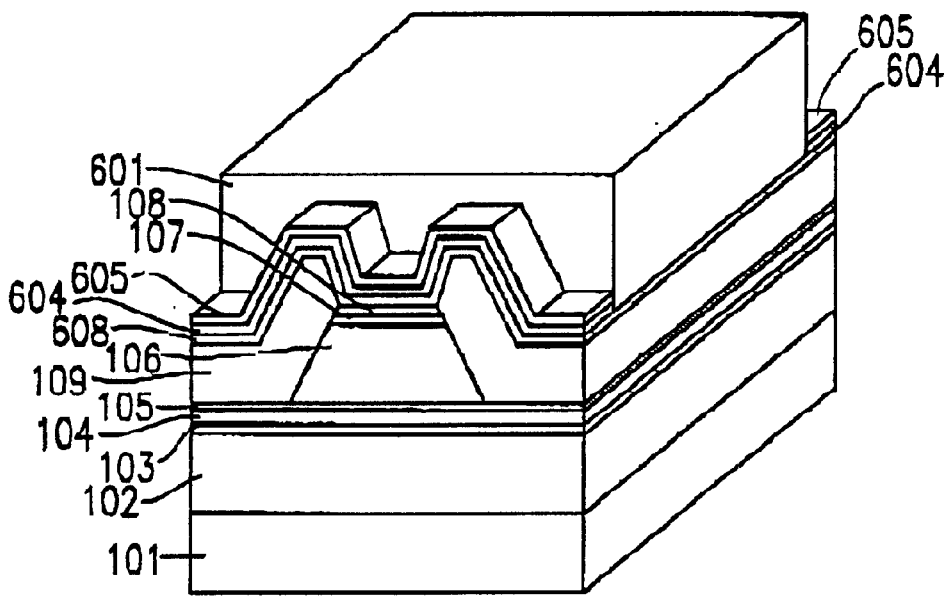

Next, a ZnO film 604 is formed on the exposed face of the AlGaAs mixed crystal layer 608. Moreover, an SiO₂ film 605 is formed on the ZnO film 604, whereby a layered structure 600b is obtained as shown in FIG. 13B.

Thereafter, the layered structure 600b is annealed in a nitrogen atmosphere, thereby diffusing Zn atoms by using the ZnO film 604 as a Zn provision layer throughout the layers from the upper surface of the AlGaAs mixed crystal layer 608 down to the n-type AlGaInP cladding layer 102. As a result, the impurity diffusion region 602 is formed.

Figure 13C:
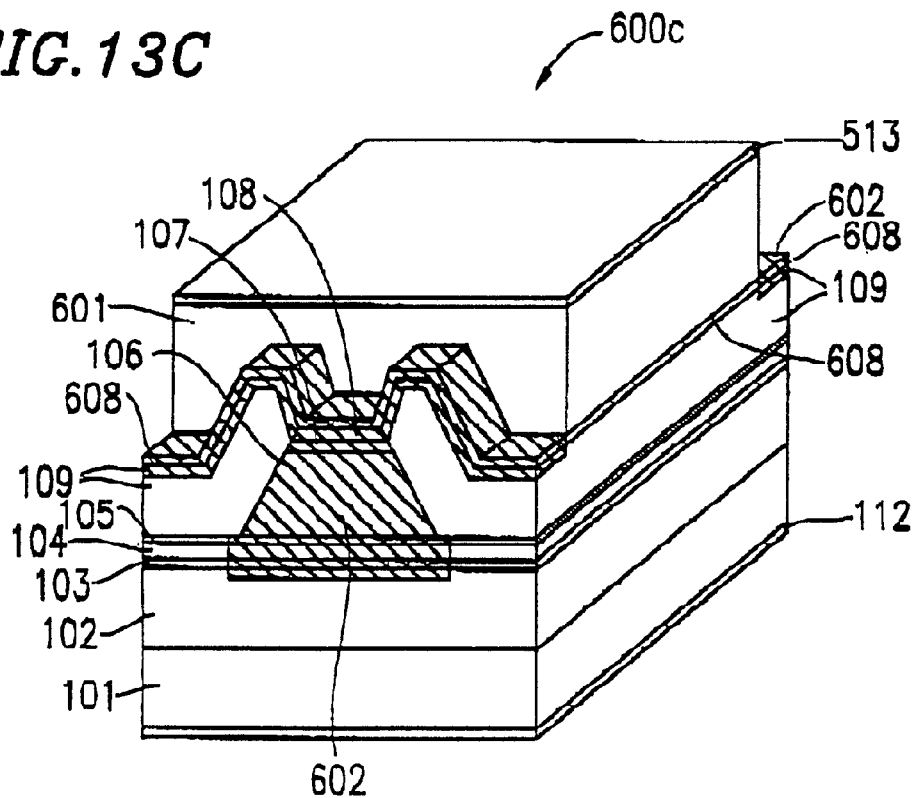

Next, the ZnO film 604 and the SiO₂ film 605 are removed by wet-etching. Then, an n-electrode 112 and a p-electrode 513 are formed, whereby a layered structure 600c is obtained as shown in FIG. 13C. In an actual production process, the resultant layered structure is cleaved along a plane in the impurity diffusion region 602 which is perpendicular to the longitudinal direction of the ridge stripes so as to form laser cavities. As a result, a single semiconductor laser element 600 is obtained.

In the production method of the semiconductor laser element 600 according to embodiment 9, Zn atoms are diffused through the AlGaAs mixed crystal layer 608, whereby the Zn concentration in the active layer 103 can be set so as to be low. Thus, optical loss in the waveguide formed by the ridge structure due to carrier scattering in the active layer 103 can be suppressed. Moreover, by appropriately adjusting the composition of the AlGaAs mixed crystal layer 608, selective etching of the p-type GaAs contact layer 601 can be readily performed, and accordingly, the end face window structure can be readily formed.

Embodiment 10

Figure 14:
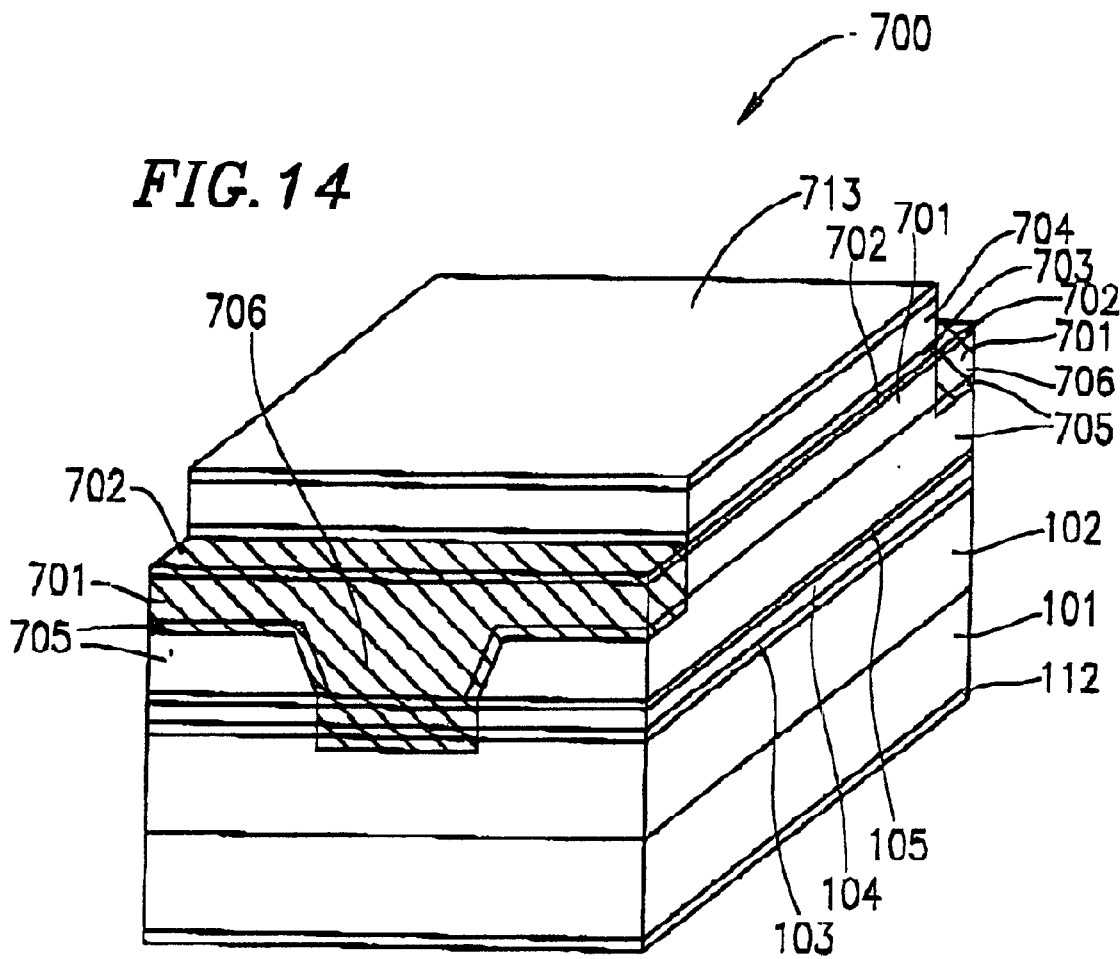
FIG. 14 shows a semiconductor laser element having an end face window structure according to embodiment 10 of the present invention.

A semiconductor laser element 700 according to embodiment 10 of the present inventions and a production method thereof are described. FIG. 14 is a perspective view of the semiconductor laser element 700. The semiconductor laser element 700 is a high-power AlGaInP red semiconductor laser element of a lateral mode control type, which has an end face window structure.

According to embodiment 1, the semiconductor laser element 100 has an end face window structure in which the n-type GaAs current confinement layer 109 is formed so as to cover the side faces of the p-type AlGaInP second cladding layer 106. On the other hand, the semiconductor laser element 700 is characterized in including a buried end face window structure.

As shown in FIG. 14, the semiconductor laser element 700 includes an n-type GaAs substrate 101, an n-type AlGaInP cladding layer 102, an active layer 103 which has a quantum well structure, a p-type AlGaInP first cladding layer 104, a p-type GaInP etching stop layer 105, a p-type AlGaInP buried second cladding layer 701, a p-type GaInP band discontinuity relaxation layer 702, a p-type AlGaAs etching stop layer 703, a p-type G&s contact layer 704, an n-type AlGaInP current confinement layer 705, an n-electrode 112, and a p-electrode 713. The p-type AlGaAs etching stop layer 703 includes AlGaAs mixed crystals, and acts as a diffusion control thin film according to the present invention. As shown in FIG. 1B, the active layer 103 includes a plurality of GaInP well layers 120 and a plurality of AlGaInP barrier layers 121.

In view of a lateral mode control of laser light, the p-type AlGaInP buried second cladding layer 701 is formed into a mesa shape. Moreover, an impurity diffusion region 706 is formed by solid phase diffusion of Zn.

Now, an operation of the semiconductor laser element 700 having the above structure is described. The structure of the semiconductor laser element 700 is a so-called real-refractive-index-guided-self-aligned structure. In this structure, a current injected to the semiconductor laser element 700 is concentrated in the active layer 103 immediately under the p-type AlGaInP buried second cladding layer 701 of the mesa structure. The refractive index of the n-type AlGaInP current confinement layer 705 is smaller than that of the p-type AlGaInP buried second cladding layer 701. Therefore, in the structure of the semiconductor laser element 700, a lateral refractive index distribution occurs, whereby light is confined in a lateral direction. Furthermore, since the bandgap of the n-type AlGaInP current confinement layer 705 is larger than that of the active layer 103, laser light is not absorbed by the n-type AlGaInP current confinement layer 705, and therefore, optical loss is not caused.

Thus, in the semiconductor laser element 700 according to embodiment 10, the threshold current can be reduced, and the differential quantum efficiency can be increased, as compared to a conventional loss waveguide structure. Such characteristics are advantageous for high-power operation of a semiconductor laser element 700. On the other hand since damages in end faces cannot be avoided, an end face structure similar to the end face structure as described in embodiment 1 is required. However, in the laser element structure according to embodiment 10, it is not easy to regrow the p-type AlGaInP buried second cladding layer 701 after the end face structure has been formed in the double hetero structure.

Now, the production method of the semiconductor laser element 700 is described. FIGS. 15A through 15E show steps of producing the semiconductor laser element 700.

Figure 15A:
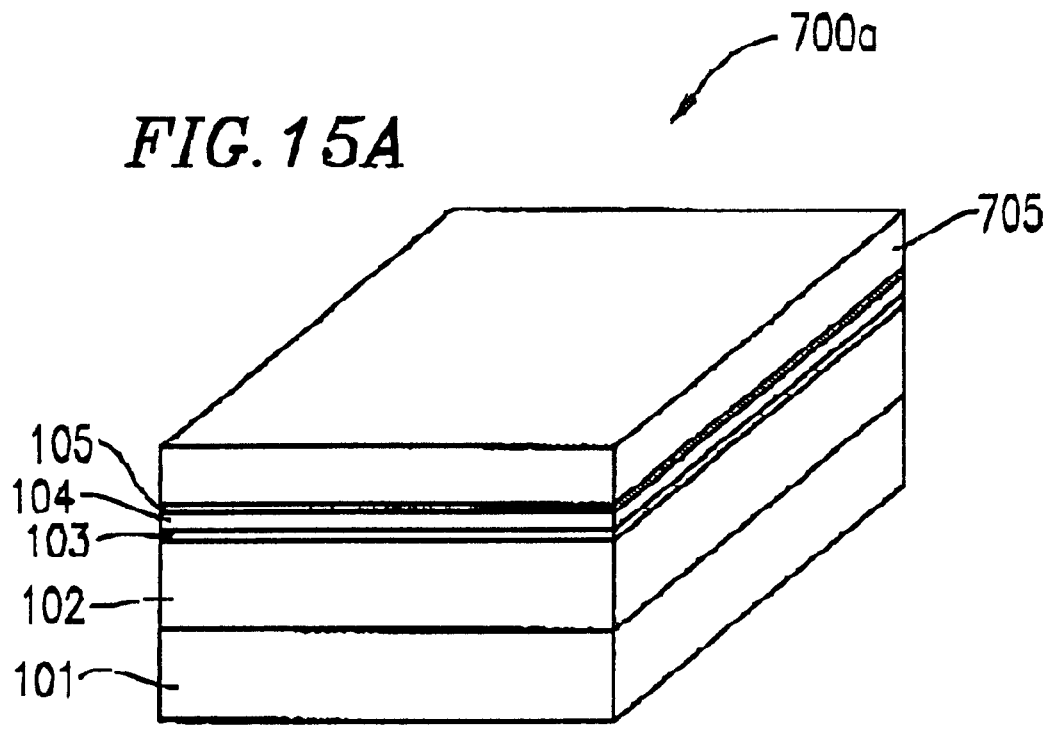

In the first step, on an n-type GaAs substrate 101, an n-type AlGaInP cladding layer 102, an active layer 103 which has a quantum well structure, a p-type AlGaInP first cladding layer 104, a p-type GaInP etching stop layer 105, and the n-type AlGaInP current confinement layer 705 are sequentially formed by an MOVPE method, thereby forming a layered structure 700a having a double hetero structure, as shown in FIG. 15A.

Figure 15B:
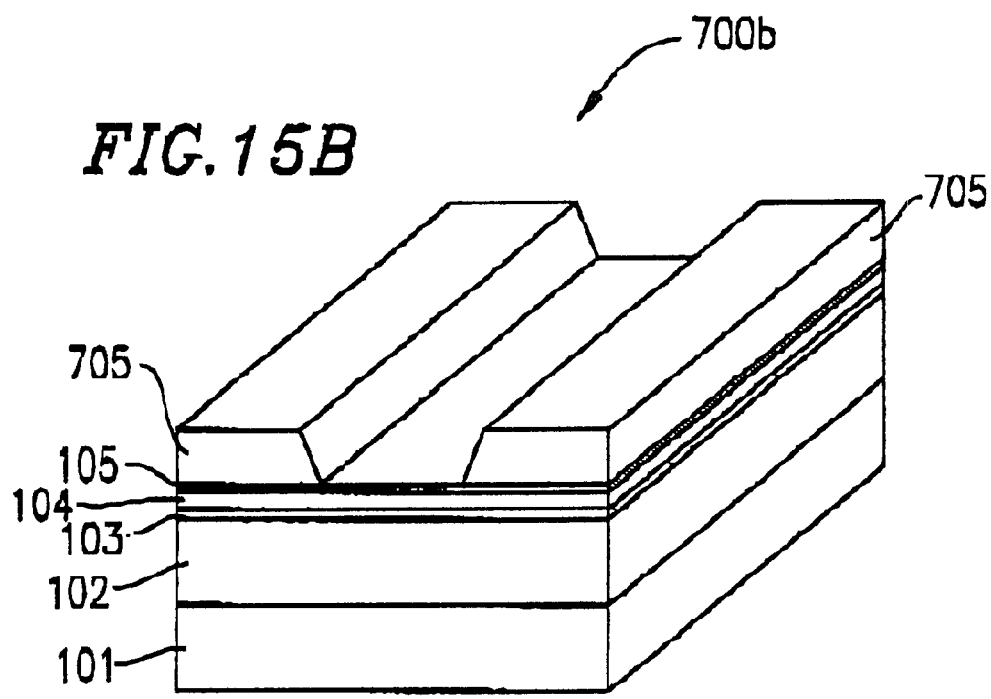

Next, a photoresist is applied over the layered structure 700a so as to have a stripe opening portion (e.g., about a 3 μm width) running in a longitudinal direction of a laser cavity. Then, the n-type AlGaInP current confinement layer 705 in the stripe opening portion is selectively removed by using a sulfuric etchant, whereby a layered structure 700b having a groove in the n-type AlGaInP current confinement layer 705 is obtained as shown in FIG. 15B.

Figure 15C:
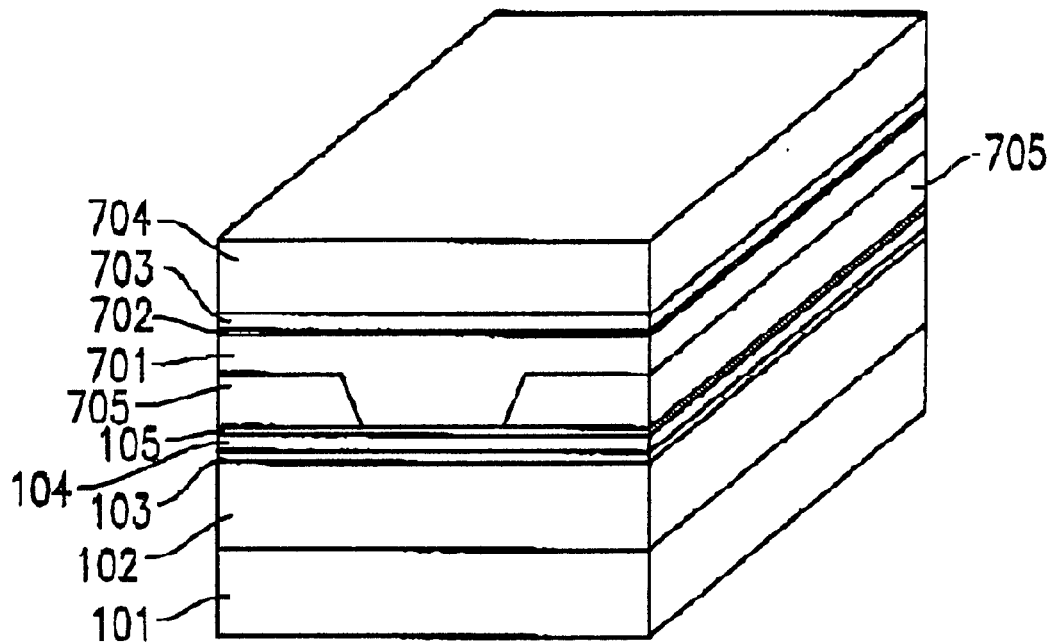
Figure 16:
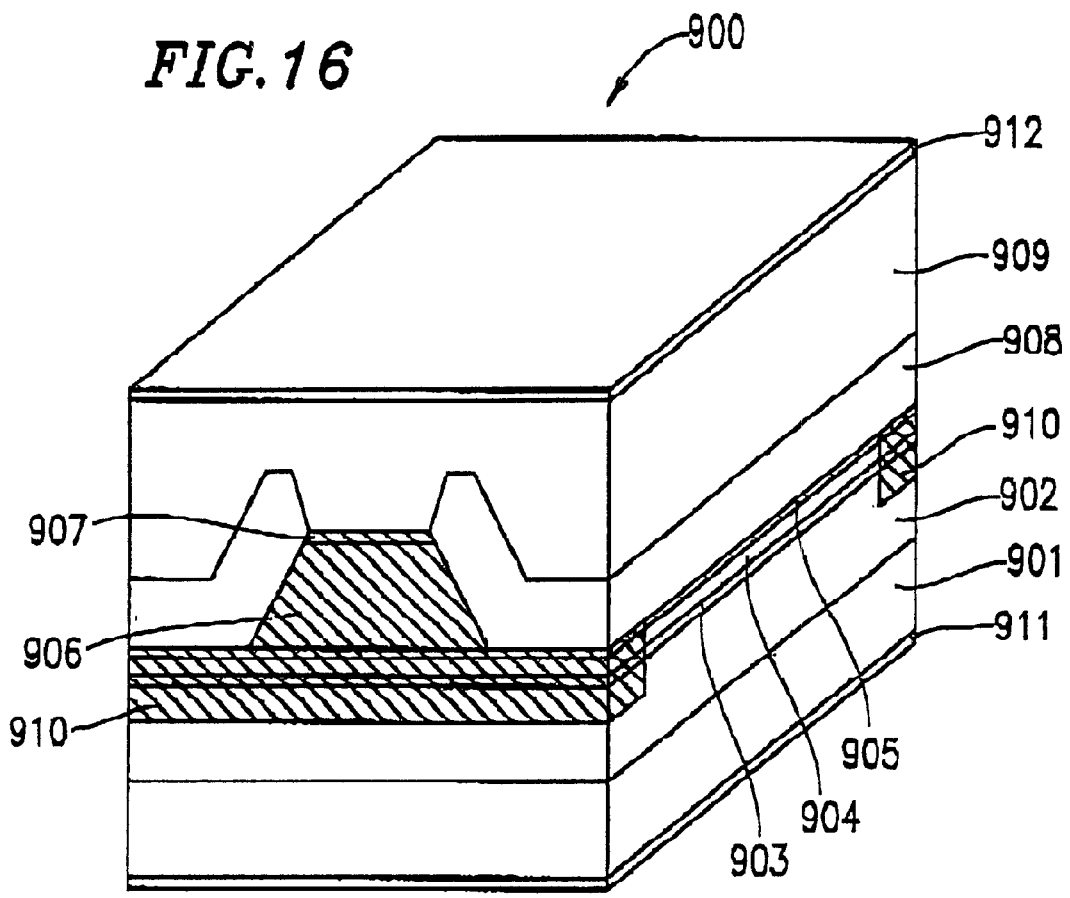
FIG. 16 shows a conventional semiconductor laser element having an end face window structure.
Figure 17A:
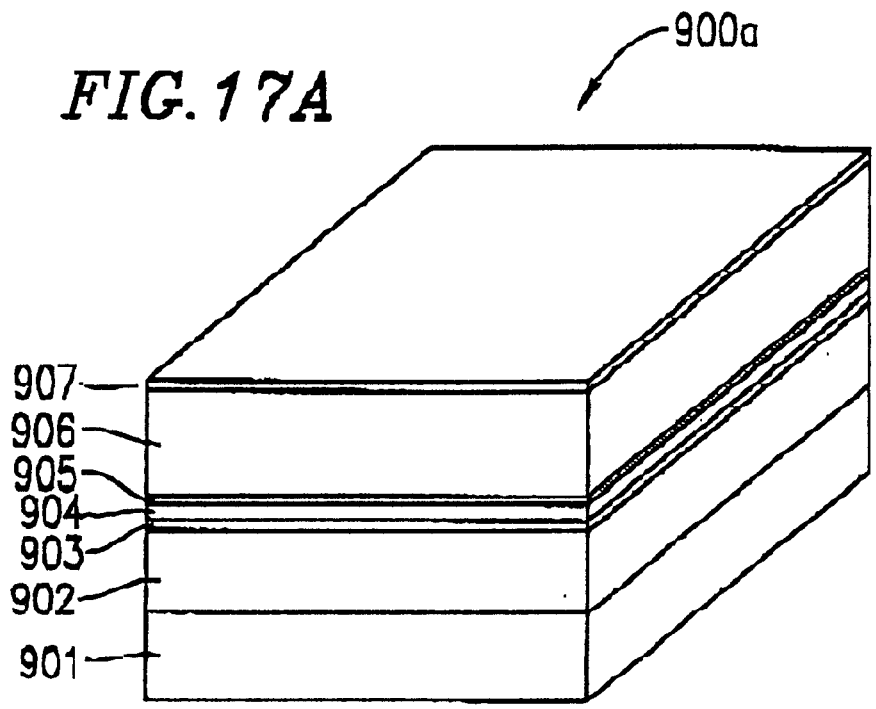
FIGS. 17A through 17F show steps of a method for producing the conventional semiconductor laser element having an end face window structure shown in FIG. 16.
Figure 17B:
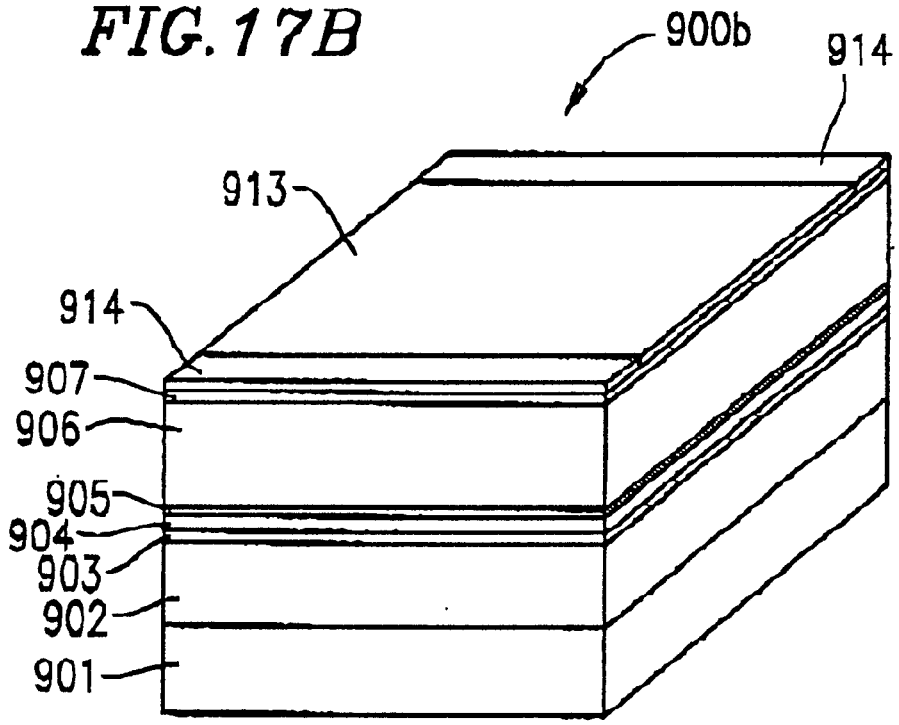
Figure 17C:
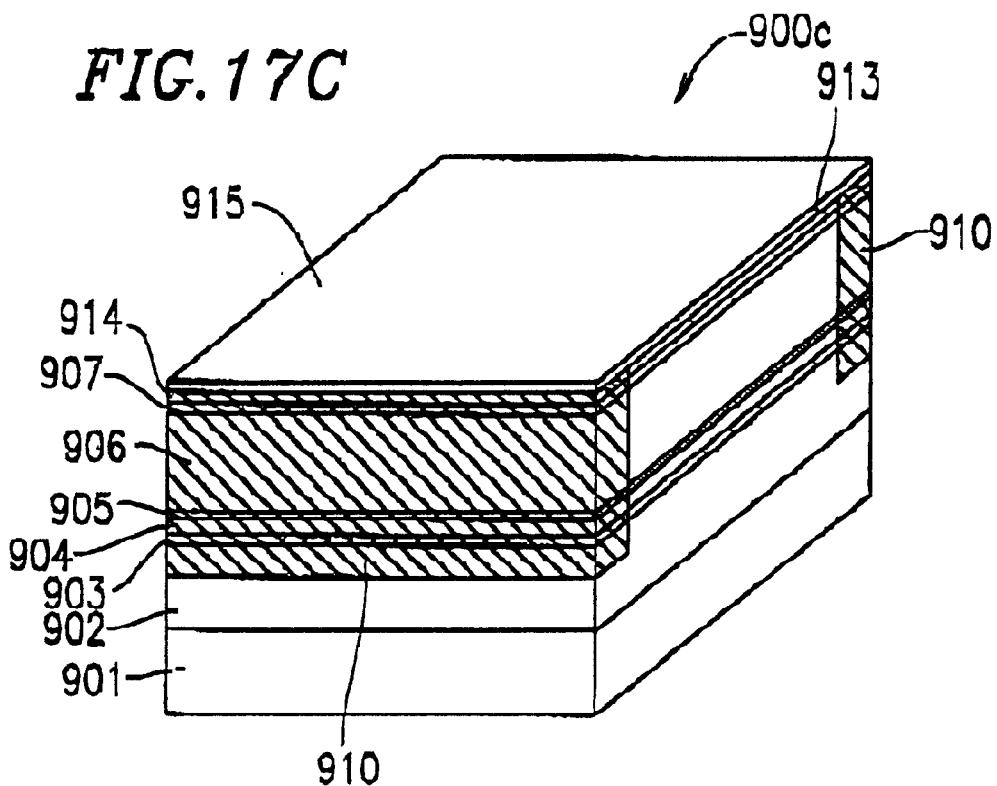
Figure 17D:
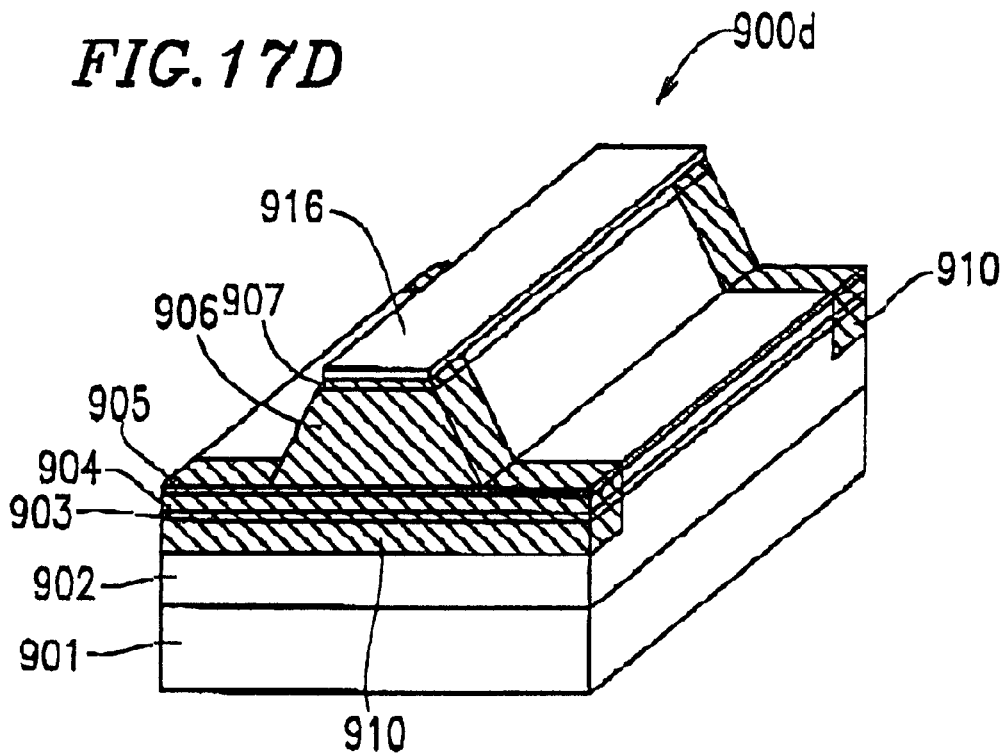
Figure 17E:
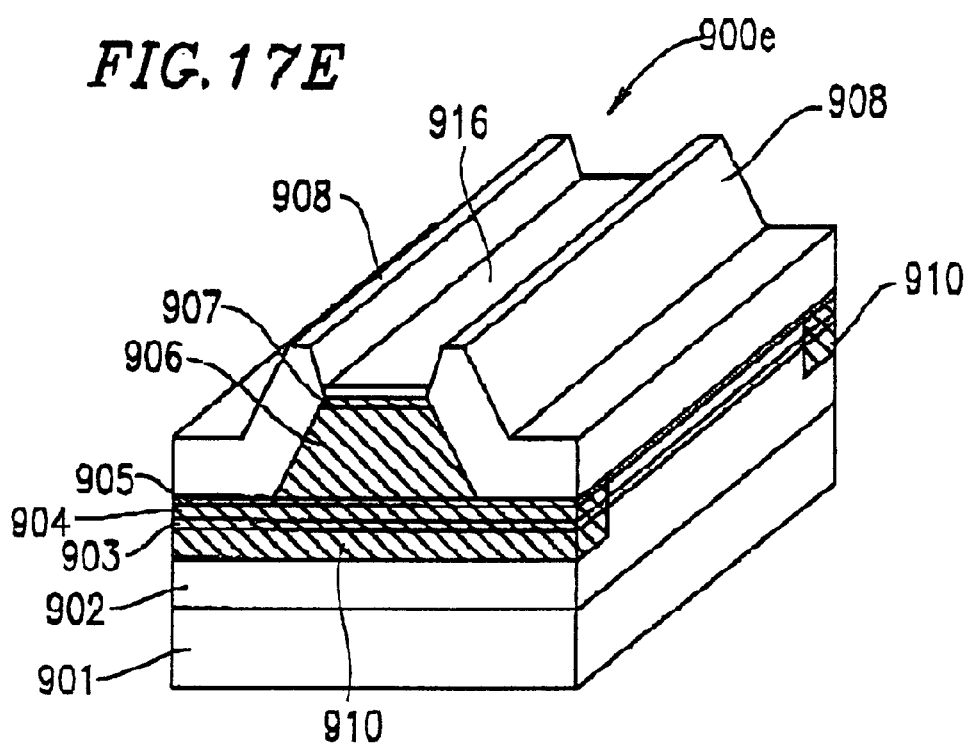
Figure 17F:
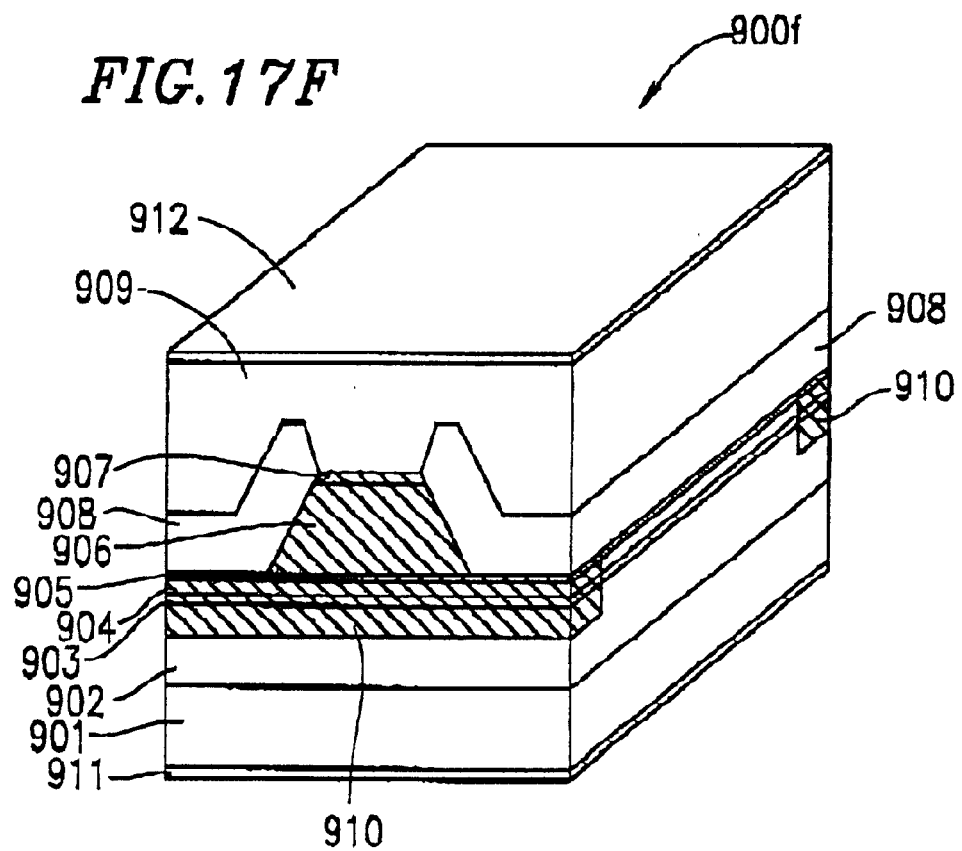

Thereafter, the p-type AlGaInP buried second cladding layer 701, the p-type GaInP band discontinuity relaxation layer 702, the p-type AlGaAs etching stop layer 703, and the p-type GaAs contact layer 704 are grown by crystal growth over the n-type AlGaInP current confinement layer 705 and the p-type GaInP etching stop layer 105, whereby a layered structure 700c is obtained as shown in FIG. 15C.

Next, an SiO₂ film 707 Is formed over the p-type GaAs contact layer 704. Then, an opening portion having a width of several tens of micrometers is formed in the SiO₂ film 707 over a region in which a cavity end face portion is to be formed, and the p-type GaAs contact layer 704 in the opening portion is removed by wet-etching. In these steps the AlAs composition in the p-type AlGaAs etching stop layer 703 is set to about 20% or more, whereby the p-type GaAs contact layer 704 can be readily etched in a selective manner. Herein, the p-type GaAs contact layer 704 may include AlGaAs mixed crystals in which the AlAs composition is equal to or smaller than about 20%. Note that, an embodiment may be possible within the scope of the present invention, in which the p-type GaAs contact layer 704 is not completely removed and is left as a thin film having a thickness of about 300 nm or less. In such a case, the remaining p-type. GaAs contact layer 704 can form a part of a diffusion control thin film. Thereafter, a ZnO film 708 and an SiO₂ film 709 are formed by sputtering over the p-type AlGaAs etching stop layer 703 and the p-type GaAs contact layer 704, whereby a layered structure 700d is obtained as shown in FIG. 15D.

Next, the layered structure 700d is annealed at about 560° C. for about 1 hour. In this annealing step, Zn atoms are diffused into the active layer 103 immediately under the opening portion, whereby a part of the active layer 103 of the quantum well structure is disordered.

In the layered structure 700d, all the layers formed over the p-type AlGaInP buried second cladding layer 701 having a mesa structure are p-type layers. However, there is an n-type layer (i.e., the n-type AlGaInP current confinement layer 705) on side faces of the p-type AlGaInP buried second cladding layer 701. According to a study conducted by the present inventors, it was found that in the p-type layers, Zn atoms are diffused so that they reach the active layer 103, whereas in the n-type layers, the diffusion rate of Zn atoms is significantly decreased as described in embodiment 8. In an experiment conducted by the present inventors, Zn atoms pass through the n-type layers for about one hour by annealing at about 600° C. On the other hand, Zn atoms pass through the p-type layers for about 5 minutes by annealing at about 600° C. That is, the diffusion rate in the n-type layers is 1/12 of the diffusion rate in the p-type layers. Such a slow diffusion rate enables selective diffusion of Zn atoms while maintaining a current confinement effect. Note that a material of the above n-type layers is not limited to AlGaInP.

In this way, the active layer 103 having the quantum well structure in the impurity diffusion region 706 in disordered. In the active layer 103, the band gap in a disordered portion is larger than that in a non-disordered portion, and thus,-the disordered portion of the active layer 103 acts as an end face window structure.

After the impurity diffusion region 706 has been formed, the SiO₂ film 707, the ZnO film 708, and the SiO₂ film 709 are removed by wet-etching. Then, an n-electrode 112 and a p-electrode 713 are formed, whereby a layered structure 700e is obtained as shown in FIG. 15E. In the final step, the layered structure 700e is cleaved along a plane in the impurity diffusion region 706 which is perpendicular to the longitudinal direction of the groove formed in the n-type AlGaInP current confinement layer 705, thereby forming a laser cavity. As a result, a single semiconductor laser element 700 is obtained.

As described above, in the semiconductor laser element 700, the p-type AlGaAs etching stop layer 703 including AlGaAs mixed crystals is provided between the ZnO film 706 and the p-type AlGaInP buried second cladding layer 701. In such a structure, the Zn concentration in the active layer 103 is maintained so as to be low, and as a result, optical loss in the waveguide formed by the ridge structure due to carrier scattering in the active layer 103 can be suppressed.

In the above embodiments of the present invention, AlGaInP semiconductor laser elements have been described as examples of the present invention. Although the present invention achieves magnificent effects in AlGaInP semiconductor laser elements, the structure and materials. of the semiconductor laser element according to the present invention are not limited thereto. For example, the present invention is applicable to AlGaAs/GaAs and InGaAsP/InP semiconductor laser elements, etc.

As described hereinabove, according to the present invention, in a process for producing a semiconductor laser element having an end face window structure, an AlGaAs mixed crystal layer is provided as a diffusion control thin film between an impurity source (impurity provision layer) and a double hetero structure. With this diffusion control thin film, introduction of Zn atoms into the double hetero structure is suppressed during disordering an active layer of a quantum well structure, whereby the Zn concentration in the double hetero structure can be maintained so as to be low. As a result, in an etching step for forming a ridge stripe, etching is prevented from advancing through a p-type etching stop layer. Therefore, a desired ridge shape can be obtained, that is, the ridge shape can be readily controlled. In addition, optical loss in a waveguide formed by the ridge structure due to free carrier absorption can be reduced. Thus, the present invention is advantageous for reducing the operation current, improving the production yield, and therefore, improving the reliability of a semiconductor laser element.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor laser element, comprising steps of:
   forming a semiconductor layered structure on a first conductivity type semiconductor substrate, the semiconductor layered structure including a first conductivity type cladding layer, a quantum well active layer, and a first cladding layer of a second conductivity type,
   forming a diffusion control layer in a predetermined region on the semiconductor layered structure;
   forming a material layer which acts as an impurity source on the diffusion control layer; and
   diffusing impurities by a first thermal treatment from the material layer through the diffusion control layer into at least a part of the semiconductor layered structure including at least a part of the quantum well active layer, thereby forming an impurity diffusion region,
   wherein a part of the quantum well active layer in at least one cavity end face is disordered by diffusion of the impurities.

2. A method for producing a semiconductor laser element according to claim 1, wherein the semiconductor layered structure includes a double hetero structure.

3. A method for producing a semiconductor laser element according to claim 1, wherein the semiconductor layered structure is epitaxially grown on the first conductivity type semiconductor substrate.

4. A method for producing a semiconductor laser element according to claim 1, wherein the quantum well active layer is formed between the first conductivity type cladding layer and the first cladding layer of the second conductivity type.

5. A method for producing a semiconductor laser element according to claim 1, wherein the quantum well active layer has a quantum well structure including at least one well layer and a plurality of barrier layers.

6. A method for producing a semiconductor laser element according to claim 5, wherein the thickness of the quantum well active layer is equal to or less than about 20 nm.

7. A method for producing a semiconductor laser element according to claim 1, wherein the diffusion control layer is formed on an upper surface of the semiconductor layered structure.

8. A method for producing a semiconductor laser element according to claim 7, wherein the diffusion control layer is epitaxially grown on the upper surface of the semiconductor layered structure.

9. A method for producing a semiconductor laser element according to claim 1, wherein the diffusion control layer includes AlGaAs mixed crystals.

10. A method for producing a semiconductor laser element according to claim 1, further comprising a step of forming a dielectric film on the material layer.

11. A method for producing a semiconductor laser element according to claim 10, wherein the dielectric film includes at least one of $SiO_2$, $Al_2O_3$, $TiO_2$, and SiN.

12. A method for producing a semiconductor laser element according to claim 1, wherein the diffusion control layer includes a material in which a diffusion rate of the impurities are lower than in the quantum well active layer.

13. A method for producing a semiconductor laser element according to claim 1, wherein the semiconductor layered structure includes AlGaInP mixed crystals.

14. A method for producing a semiconductor laser element according to claim 1, wherein an amount of the impurities diffused into the semiconductor layered structure is controlled by controlling at least one of a conductivity type, a composition, and a thickness of the diffusion control layer.

15. A method for producing a semiconductor laser element according to claim 1, wherein an amount of the impurities diffused into the semiconductor layered structure is controlled by controlling at least one of a temperature and a time length of the first thermal treatment.

16. A method for producing a semiconductor laser element according to claim 1, wherein the diffusion control layer is of a first conductivity type.

17. A method for producing a semiconductor laser element according to claim 1, wherein the diffusion control layer is of a second conductivity type.

18. A method for producing a semiconductor laser element according to claim 1, wherein the diffusion control layer is non-conductive.

19. A method for producing a semiconductor laser element according to claim 1, wherein the diffusion control layer includes GaAs.

20. A method for producing a semiconductor laser element according to claim 1, wherein a thickness of the diffusion control layer is from about 50 nm to about 300 nm.

21. A method for producing a semiconductor laser element according to claim 1, wherein a temperature of the first thermal treatment is equal to or less than about 650° C.

22. A method for producing a semiconductor laser element according to claim 1, wherein the material layer includes at least one of Zn and Mg.

23. A method for producing a semiconductor laser element according to claim 1, wherein the material layer includes ZnO.

24. A method for producing a semiconductor laser element according to claim 1, wherein a thickness of the material layer is equal to or less than about 50 nm.

25. A method for producing a semiconductor laser element according to claim 1, wherein the diffusion control layer includes AlGaAs in which an AlAs composition is about 20% or more.

26. A method for producing a semiconductor laser element according to claim 1, wherein the semiconductor layered structure further includes a second conductivity type contact layer.

27. A method for producing a semiconductor laser element according to claim 26, wherein the second conductivity type contact layer includes AlGaAs in which an AlAs composition is about 20% or less.

28. A method for producing a semiconductor laser element according to claim 1, wherein an undoped semiconductor layer is formed between the first conductivity type cladding layer and the quantum well active layer.

29. A method for producing a semiconductor laser element according to claim 28, wherein a thickness of the undoped semiconductor layer is equal to or greater than about 40 nm.

30. A method for producing a semiconductor laser element according to claim 1, further comprising a step of forming a low reflective coating film on the at least one cavity end face.

31. A method for producing a semiconductor laser element according to claim 1, wherein the semiconductor layered structure includes:
   a second conductivity type etching stop layer formed on the first cladding layer of the second conductivity type; and
   a second cladding layer of a second conductivity type formed on the second conductivity type etching stop layer.

32. A method for producing a semiconductor laser element according to claim 31, further comprising steps of:
   etching the second cladding layer of the second conductivity type into a ridge shape; and
   forming a first conductivity type current confinement layer on a side face of the second cladding layer of the second conductivity type.

33. A method for producing a semiconductor laser element according to claim 32, further comprising a step of removing the diffusion control layer,
   wherein after the step of removing the diffusion control layer, the second cladding layer of the second conductivity type is etched into a ridge shape.

34. A method for producing a semiconductor laser element according to claim 32, further comprising a step of performing a second thermal treatment after the step of forming the first conductivity type current confinement layer.

35. A method for producing a semiconductor laser element according to claim 32, wherein the stop of forming the material layer is performed after the step of forming the first conductivity type current confinement layer.

36. A method for producing a semiconductor laser element according to claim 31, wherein the conductivity type of the diffusion control layer is the first conductivity type.

37. A method for producing a semiconductor laser element according to claim 31, wherein:

the quantum well active layer has a quantum well structure including at least one well layer and a plurality of barrier layers; and a thickness of the quantum well structure is equal to or less than about 7 nm.

38. A method for producing a semiconductor laser element according to claim 31, wherein a thickness of the second conductivity type etching stop layer is equal to or less than about 15 nm.

39. A method for producing a semiconductor laser element according to claim 31, wherein in the step of diffusing impurities into at least a part of the semiconductor layered structure, impurities diffused into a part of the second cladding layer of the second conductivity type, and a concentration of the impurities diffused in a part of the second cladding layer of the second conductivity type within the impurity diffusion region is equal to or less than about $1 \times 10^{18}$ cm$^{-3}$.

40. A method for producing a semiconductor laser element according to claim 1, wherein the semiconductor layered structure further includes a second conductivity type etching stop layer formed on the first cladding layer of the second conductivity type, the method further comprising steps of:

forming a first conductivity type current confinement layer on the semiconductor layered structure;

forming an opening portion in the first conductivity type current confinement layer; and forming a second cladding layer of a second conductivity type on the first conductivity type current confinement layer and the opening portion, wherein the step of forming the diffusion control layer is performed after the step of forming the second cladding layer of the second conductivity type.

41. A semiconductor laser element, comprising:

a first conductivity type semiconductor substrate; and a semiconductor layered structure, wherein the semiconductor layered structure includes:
a first conductivity type cladding layer;
a quantum well active layer;
a first cladding layer of a second conductivity type;
a second conductivity type etching stop layer:
a second cladding layer of a second conductivity type having a ridge shape; and
a first conductivity type current confinement layer formed on a side face of the second cladding layer of the second conductivity type,
wherein a part of the quantum well active layer which is positioned under the second cladding layer of the second conductivity type and on at least one cavity end face is disordered by impurities.

42. A semiconductor laser element according to claim 41, wherein the semiconductor layered structure includes a double hetero structure.

43. A semiconductor laser element according to claim 41, wherein the quantum well active layer is formed between the first conductivity type cladding layer and the first cladding layer of the second conductivity type.

44. A semiconductor laser element according to claim 41, wherein the quantum well active layer has a quantum well structure including at least one well layer and a plurality of barrier layers.

45. A semiconductor laser element according to claim 41, wherein the semiconductor layered structure includes AlGaInP mixed crystals.

46. A semiconductor laser element according to claim 41, wherein the semiconductor layered structure further includes a second conductivity type contact layer.

47. A semiconductor laser element according to claim 41, further comprising a low reflective coating film on the at least one cavity end face.

48. A semiconductor laser element, comprising:
a first conductivity type semiconductor substrate; and
a semiconductor layered structure,
wherein the semiconductor layered structure includes:
a first conductivity type cladding layer;
a quantum well active layer;
a first cladding layer of a second conductivity type;
a second conductivity type etching stop layer;
a first conductivity type current confinement layer having an opening portion; and
a second cladding layer of a second conductivity type provided at least in the opening portion,
wherein a part of the quantum well active layer which is positioned under the opening portion and on at least one cavity end face is disordered by impurities.

49. A semiconductor laser element according to claim 48, wherein the semiconductor layered structure includes a double hetero structure.

50. A semiconductor laser element according to claim 48, wherein the quantum well active layer is formed between the first conductivity type cladding layer and the first cladding layer of the second conductivity type.

51. A semiconductor laser element according to claim 48, wherein the quantum well active layer has a quantum well structure including at least one well layer and a plurality of barrier layers.

52. A semiconductor laser element according to claim 48, wherein the semiconductor layered structure includes AlGaInP mixed crystals.

53. A semiconductor laser element according to claim 48, wherein the semiconductor layered structure further includes a second conductivity type contact layer.

* * * * *